United States Patent
Kudo et al.

(10) Patent No.: US 10,586,768 B2
(45) Date of Patent: Mar. 10, 2020

(54) LINE STRUCTURE AND A METHOD FOR PRODUCING THE SAME

(71) Applicant: Dai Nippon Printing Co., Ltd., Tokyo (JP)

(72) Inventors: Hiroshi Kudo, Tokyo (JP); Takamasa Takano, Tokyo (JP)

(73) Assignee: DAI NIPPON PRINTING CO., LTD., Tokyo (JP)

(*) Notice: Subject to any disclaimer, the term of this patent is extended or adjusted under 35 U.S.C. 154(b) by 0 days.

(21) Appl. No.: 16/151,543

(22) Filed: Oct. 4, 2018

(65) Prior Publication Data

US 2019/0035742 A1 Jan. 31, 2019

Related U.S. Application Data

(63) Continuation of application No. 15/636,859, filed on Jun. 29, 2017, now Pat. No. 10,121,748, which is a (Continued)

(30) Foreign Application Priority Data

Nov. 5, 2012 (JP) .................................. 2012-243593

(51) Int. Cl.
*H01L 23/532* (2006.01)
*H01L 23/522* (2006.01)
(Continued)

(52) U.S. Cl.
CPC .. *H01L 23/53238* (2013.01); *H01L 21/02063* (2013.01); *H01L 21/02071* (2013.01);
(Continued)

(58) Field of Classification Search
CPC ........... H01L 23/53238; H01L 23/5329; H01L 23/5226; H01L 21/76877; H01L 21/7685; H01L 24/04; H01L 24/07; H01L 24/12
See application file for complete search history.

(56) References Cited

U.S. PATENT DOCUMENTS 6,288,447 B1 9/2001 Amishiro
6,291,331 B1 9/2001 Wang
(Continued)

FOREIGN PATENT DOCUMENTS

EP 2 187 439 A1 5/2010
JP H02-125447 A 5/1990
(Continued)

OTHER PUBLICATIONS

Japanese Office action for 2017-150462 dated Nov. 6, 2018.
(Continued)

*Primary Examiner* — Christine A Enad
(74) *Attorney, Agent, or Firm* — Pearne & Gordon LLP

(57) ABSTRACT

A multi-layer line structure including a substrate, a lower layer Cu line located on the substrate, an upper layer Cu line located on an insulating layer including an inorganic film located on the lower layer Cu line and an organic resin film located on the inorganic film, and a via connection part located in a via connection hole running in an up-down direction through the insulating layer in an area where the lower layer Cu line and the upper layer Cu line overlap each other is provided. The via connection part includes a barrier conductive layer located on a part of the lower layer Cu line exposed to a bottom part of the via connection hole and on an inner wall of the via connection hole.

15 Claims, 27 Drawing Sheets

Related U.S. Application Data continuation of application No. 14/704,096, filed on May 5, 2015, now Pat. No. 9,735,108, which is a continuation of application No. PCT/JP2013/079910, filed on Nov. 5, 2013.

(51) Int. Cl.

| | | |
|---|---|---|
| *H01L 21/768* | (2006.01) | |
| *H01L 23/498* | (2006.01) | |
| *H01L 21/02* | (2006.01) | |
| *H05K 3/46* | (2006.01) | |
| *H01L 21/3105* | (2006.01) | |
| *H01L 21/311* | (2006.01) | |
| *H05K 1/02* | (2006.01) | |

(52) U.S. Cl.
CPC .. *H01L 21/02126* (2013.01); *H01L 21/02274* (2013.01); *H01L 21/31058* (2013.01); *H01L 21/31116* (2013.01); *H01L 21/7685* (2013.01); *H01L 21/76877* (2013.01); *H01L 23/49822* (2013.01); *H01L 23/5226* (2013.01); *H01L 23/5329* (2013.01); *H01L 23/53295* (2013.01); *H05K 3/4688* (2013.01); *H01L 21/76832* (2013.01); *H01L 21/76834* (2013.01); *H01L 21/76885* (2013.01); *H01L 2924/0002* (2013.01); *H05K 1/0231* (2013.01); *H05K 3/4679* (2013.01); *H05K 2201/068* (2013.01)

(56) References Cited

U.S. PATENT DOCUMENTS

| | | | |
|---|---|---|---|
| 6,656,828 | B1 | 12/2003 | Maitani |
| 7,470,619 | B1 | 12/2008 | Chen |
| 2002/0001941 | A1 | 1/2002 | Kudo |
| 2004/0132278 | A1 | 7/2004 | Oryoji |
| 2005/0221602 | A1 | 10/2005 | Bradl |
| 2005/0253266 | A1 | 11/2005 | Tsumura |
| 2006/0192286 | A1 | 8/2006 | Kanamura |
| 2007/0194450 | A1 | 8/2007 | Tyberg |
| 2008/0006945 | A1* | 1/2008 | Lin ..................... H01L 23/3192 257/758 |
| 2008/0054444 | A1 | 3/2008 | Tuttle |
| 2009/0152602 | A1 | 6/2009 | Akiyama |
| 2009/0175023 | A1* | 7/2009 | Sakamoto ........... H01L 21/4857 361/820 |
| 2009/0200670 | A1* | 8/2009 | Sunayama .......... H01L 21/2855 257/751 |
| 2009/0206490 | A1 | 8/2009 | Koide et al. |
| 2009/0243046 | A1 | 10/2009 | Shi |
| 2012/0211885 | A1 | 8/2012 | Choi et al. |
| 2012/0261827 | A1 | 10/2012 | Yu |
| 2012/0300425 | A1 | 11/2012 | Nakashima et al. |
| 2013/0077272 | A1* | 3/2013 | Lin ......................... H01L 22/32 361/760 |
| 2015/0311142 | A1 | 10/2015 | Sekar et al. |

FOREIGN PATENT DOCUMENTS

| | | |
|---|---|---|
| JP | H11-168141 A | 6/1999 |
| JP | H11-354635 A | 12/1999 |
| JP | 2000-150519 A | 5/2000 |
| JP | 2000-216264 A | 8/2000 |
| JP | 2000-332107 A | 11/2000 |
| JP | 2001-210833 A | 8/2001 |
| JP | 2004-111915 A | 4/2004 |
| JP | 2004-153126 A | 5/2004 |
| JP | 2005-150493 A | 6/2005 |
| JP | 2005-183766 A | 7/2005 |
| JP | 2006-324301 A | 11/2006 |
| JP | 2008-016502 A | 1/2008 |
| JP | 2009-088177 A | 4/2009 |
| JP | 2009-194144 A | 8/2009 |
| JP | 2012-114400 A | 6/2012 |
| JP | 2012-175099 A | 9/2012 |
| WO | 00/44043 A1 | 7/2000 |
| WO | 2009/084301 A1 | 7/2009 |
| WO | 2011/089936 A1 | 5/2013 |

OTHER PUBLICATIONS

International Search Report issued in Application No. PCT/JP2013/079910 dated Feb. 10, 2014.
Partial English translation of Japanese Patent Publication No. JP H11-354635.
Partial English translation of Japanese Patent Publication No. JPH11-168141.
Partial English translation of Japanese Patent Publication No. JP H02-125447.
Partial English translation of Japanese Patent Publication No. 2000-332107.
Translation of International Preliminary Report on Patentability issued in Application No. PCT/JP2013/079910 dated Feb. 24, 2015.
Japanese Office action for 2016-083558 dated Sep. 5, 2017.
Japanese Office Action for 2014-544625 dated Feb. 6, 2018.
Japanese Office Action for 2017-150462 dated Apr. 24, 2018.
Japanese Office Action for Application No. 2014-544625, dated Aug. 21, 2018.

* cited by examiner

LINE STRUCTURE AND A METHOD FOR PRODUCING THE SAME

CROSS REFERENCE TO RELATED APPLICATION

This is a continuation application of Ser. No. 15/636,859 filed on Jun. 29, 2017 which is a continuation of application Ser. No. 14/704,096 filed on May 5, 2015 and is based upon and claims the benefit of priority from Japanese Patent Applications No. 2012-243593 filed on Nov. 5, 2012 and the prior PCT Application PCT/JP2013/079910 filed on Nov. 5, 2013, the entire contents of which are incorporated herein by reference.

FIELD

The present invention relates to a multi-layer line structure and a method for producing the same, and particularly to a multi-layer line structure including a plurality of Cu lines provided in a plurality of layers having an insulating layer therebetween, and a method for producing the same.

BACKGROUND

A multi-layer line structure including a plurality of lines provided in a plurality of layers and also including a connection hole provided to connect the plurality of lines located in the plurality of layers is known (see, for example, Japanese Laid-Open Patent Publication No. 2000-150519). In such a multi-layer line structure, an organic resin material such as polyimide or the like is often used as an insulating layer provided between the layers. A reason for this is an organic resin material generally has a low dielectric constant and thus is unlikely to cause delay of a signal transmitted through the lines.

However, an organic resin material has a thermal expansion coefficient that is higher than that of a material of lines, for example, copper or the like. Therefore, when a line structure is subjected to a heat cycle test or used in a high temperature environment, a disconnecting is likely to occur at, for example, a bottom part of the connection hole due to a difference in the thermal expansion coefficient between the resin material and the lines.

This will be described specifically. The thermal expansion coefficient (linear expansion coefficient) of an organic material is 50 to 100 E-6/K. In the case where copper (Cu) is used as a material of a line, the thermal expansion coefficient (linear expansion coefficient) of the material of the line is 17 E-6/K. As can be seen, the thermal expansion coefficient of the organic material is several times as high as the thermal expansion coefficient of the material of the line. In the case where the line structure during production is exposed to an atmosphere exceeding, for example, 200° C., a tensile stress is caused to copper in the connection hole. The tensile stress is caused because the thermal expansion of the organic resin material acts to increase a distance between the lines above and below the organic resin material.

As a result, copper in the connection hole moves in order to alleviate the tensile stress, which forms voids at the bottom part of the connection hole. The voids cause a flaw in electric connection between the upper and lower lines.

There are other flaws in addition to the formation of the voids. Since the adhesive force between a barrier conductive layer covering the bottom part and a side surface of the connection hole, and the organic resin, is low, the barrier conductive layer is deformed and is peeled off from the organic resin.

In general, a multi-layer line structure in a printed circuit board, an interposer or the like is assumed to be used in an environment in which the temperature is changed in cycles from −25° C. to 125° C. The temperature change cycle in such an environment also causes a strong tensile stress to the copper in the connection hole, which also causes a flaw in electric connection as described above.

Recently, LSIs are reduced in size and increased in integration degree, and along with this, LSI chips tend to be mounted on more printed circuit boards and more interposers. In such a situation, there is an increasing demand for a higher density of line layers in a multi-layer line structure.

In order to realize such a high density, it is necessary to decrease the width of the lines, the interval between the lines, and the size of the connection hole. In addition, a structure called a "stacked via", in which another connection hole is stacked on the copper in the connection hole, is needed. This structure further increases the tensile stress of the copper in the connection hole, and thus raises the ratio of connection flaws. This decreases the reliability.

The present invention has an object of providing a multi-layer line structure or the like which decreases the occurrence of a disconnecting at, for example, a bottom part of a connection hole.

The tensile stress can be slightly decreased by decreasing the height of the connection hole. However, this decreases the distance between the upper and lower line layers, and thus increases the parasitic capacitance and causes crosstalk and signal propagation delay. This makes it difficult to allow the performance of LSIs mounted on printed circuit boards or interposers to be fully exhibited.

The present invention has another object of providing a multi-layer line structure or the like which suppresses the increase of parasitic capacitance and the occurrence of crosstalk and signal propagation delay as compared with a conventional multi-layer line structure even though the distance between the upper and lower line layers is decreased.

When the height of the connection hole is decreased, the effect of an additive (leveler) in an electrolytic plating solution cannot be fully exhibited for filing the connection hole with copper by electrolytic plating. Therefore, the connection hole is not fully filled with copper. As a result, voids are formed in the connection hole, which decreases the reliability, like the voids formed at the bottom part of the connection hole.

The present invention has still another object of providing a multi-layer line structure or the like which suppresses the formation of voids in a connection hole.

In a conventional multi-layer line structure in which an organic resin film is used as an insulating film provided between the copper lines, the organic resin film is in direct contact with outer circumferential surfaces of the copper lines except for the bottom part of the copper lines. Therefore, each time a heat treatment is performed, copper atoms are thermally diffused into the organic resin film around the copper lines. Also, an electric field caused between adjacent lines ionizes and diffuses the copper atoms. Such diffusion decreases the distance between the line layers. This state causes a problem that shortcircuit between the line layers and electrical breakdown of the organic resin film are likely to occur.

Regarding the structure of an LSI, Cu lines are formed by a Damascene process. According to the Damascene process, a barrier metal is located on side surfaces and bottom edges of the Cu lines in order to suppress diffusion of the Cu atoms. However, a material usable for the barrier metal, namely, a material containing Ti or Ta has a high electric resistance. Therefore, there is a problem that as the thickness of the barrier metal is larger with respect to the width of the lines, the resistance of the lines is increased.

SUMMARY

In an embodiment according to the present invention, a multi-layer line structure is provided including a substrate; a lower layer Cu line located on the substrate; an upper layer Cu line located on an insulating layer including an inorganic film located on the lower layer Cu line and an organic resin film located on the inorganic film; and a via connection part located in a via connection hole running in an up-down direction through the insulating layer in an area where the lower layer Cu line and the upper layer Cu line overlap each other. The via connection part includes a barrier conductive layer located on a part of the lower layer Cu line exposed to a bottom part of the via connection hole and on an inner wall of the via connection hole. The inorganic film is formed so as to cover a top surface and a side surface of the lower layer Cu line. A material forming the organic resin film has a dielectric constant lower than a dielectric constant of a material forming the inorganic film.

In the embodiment according to the present invention, an end of the inorganic film on the side of the inner wall of the via connection hole may be in contact with the barrier conductive layer.

In the embodiment according to the present invention, the inorganic film may contain silicon, and a material of the barrier conductive layer may contain a high-melting-point metal material or a compound thereof.

In the embodiment according to the present invention, the inorganic film and the barrier conductive layer may be in contact with each other.

In the embodiment according to the present invention, in the insulating layer present between the top surface of the lower layer Cu line and a bottom surface of the upper layer Cu line, a ratio of a thickness of the inorganic film with respect to a total of the thickness of the inorganic film and a thickness of the organic resin film may be 20% or greater and 80% or less. In the embodiment according to the present invention, the inorganic film may include a film containing silicon; and the side surface of the lower layer Cu line and a part of the top surface of the lower layer Cu line not exposed to the bottom part of the via connection hole may be covered with the film containing silicon.

In an embodiment according to the present invention, a multi-layer line structure including a stack of a plurality of layers including a first layer and a second layer adjacent to each other is provided. The first layer includes a first Cu line. The second layer includes a second Cu line; an insulating film located between the second Cu line and the first Cu line; and a via connection part located in a via connection hole running in an up-down direction through the insulating layer in an area where the first Cu line and the second Cu line overlap each other. The insulating film includes an inorganic film covering at least a surface of the second Cu line facing the first Cu line, among surfaces of the second Cu line, and an organic resin film covering the inorganic film. The via connection part includes a barrier conductive layer located on a part of the second Cu line exposed to a bottom part of the via connection hole and on an inner wall of the via connection hole. The inorganic film is formed so as to cover the surface of the second Cu line facing the first Cu line and a side surface with respect to the surface of the second Cu line facing the first Cu line, among the surfaces of the second Cu line.

In the embodiment according to the present invention, a material forming the organic resin film may have a dielectric constant lower than a dielectric constant of a material forming the inorganic film.

In the embodiment according to the present invention, an end of the inorganic film on the side of the inner wall of the via connection hole may be in contact with the barrier conductive layer.

In the embodiment according to the present invention, the inorganic film may contain silicon, and a material of the barrier conductive layer may contain a high-melting-point metal material or a compound thereof.

In the embodiment according to the present invention, the inorganic film and the barrier conductive layer may be in contact with each other.

In the embodiment according to the present invention, in the insulating layer located between the first Cu line and the second Cu line, a ratio of a thickness of the inorganic film with respect to a total of the thickness of the inorganic film and a thickness of the organic resin film may be 20% or greater and 80% or less. In the embodiment according to the present invention, the inorganic film may include a film containing silicon; and the side surface of the second Cu line and a part of a top surface of the second layer Cu line not exposed to the bottom part of the via connection hole may be covered with the film containing silicon.

In the embodiment according to the present invention, the organic resin film may include a first organic insulating film and a second organic insulating film stacked thereon; and a third Cu line may be located between the first organic insulating film and the second organic insulating film. The third Cu line may be located between the first Cu line and the second Cu line, and the via connection part may include an upper part between the first Cu line and the third Cu line and a lower part between the third Cu line and the second Cu line. A barrier conductive material may be located between the upper part and the third Cu line.

In the embodiment according to the present invention, the second layer may include a fourth Cu line at a position other than a position where the via connection hole is located, a layer located above the first layer may include a fifth Cu line, and the fourth Cu line and the fifth Cu line may not have a Cu line therebetween.

In an embodiment according to the present invention, a method for producing a multi-layer line structure is provided including forming a lower layer Cu line on a substrate, forming an inorganic film on the lower layer Cu line so as to cover a top surface and a side surface of the lower layer Cu line, forming an organic resin film on the inorganic film to form an insulating film including the inorganic film and the organic resin film, forming an opening reaching the lower layer Cu line in the insulating layer to form a via connection hole, forming a barrier conductive layer at a bottom part and on an inner wall of the via connection hole, filling the via connection hole with Cu to form a via connection part, and forming an upper layer Cu line on the via connection part. A material forming the organic resin film has a dielectric constant lower than a dielectric constant of a material forming the inorganic film.

In the embodiment according to the present invention, an end of the inorganic film on the side of the inner wall of the via connection hole may be in contact with the barrier conductive layer.

In the embodiment according to the present invention, the inorganic film may contain silicon, and a material of the barrier conductive layer may contain a high-melting-point metal material or a compound thereof. The inorganic film and the barrier conductive layer may be in contact with each other.

In the embodiment according to the present invention, in the insulating layer present between the top surface of the lower layer Cu line and a bottom surface of the upper layer Cu line, a ratio of a thickness of the inorganic film with respect to a total of the thickness of the inorganic film and a thickness of the organic resin film may be 20% or greater and 80% or less. In the embodiment according to the present invention, the inorganic film may include a film containing silicon; and the side surface of the lower layer Cu line and a part of the top surface of the lower layer Cu line not exposed to the bottom part of the via connection hole may be covered with the film containing silicon.

According to a multi-layer line structure and a method for producing the same described above, the ratio of the organic resin film with respect to an upper layers can be decreased. This can suppress a situation where voids or the like are generated at, for example, a bottom part of the via connection hole by a difference in the thermal expansion coefficient between the organic resin film and Cu, and as a result, a disconnecting occurs between the upper layer Cu line or the first line and the lower layer Cu line or the second line. In addition, increase of a line capacitance between the Cu lines can be suppressed.

The end of the inorganic insulating film on the side of the inner wall of the via connection hole is in contact with the barrier conductive film. Therefore, generation of voids at, for example, a bottom part of the via connection hole can be suppressed.

The inorganic film contains silicon, a material of the barrier conductive layer contains a high-melting-point metal material or a compound thereof, and the inorganic film and the barrier conductive layer are in contact with each other. The inorganic film containing silicon and the material containing a high-melting-point metal material or a compound thereof have a high adhesiveness. This can more effectively prevent occurrence of a disconnecting between the upper layer Cu line or the first line and the lower layer Cu line or the second line.

According to an embodiment of the present invention, a multi-layer line structure that suppresses occurrence of a disconnecting at, for example, a bottom part of a connection line is provided. Also according to an embodiment of the present invention, a multi-layer line structure that suppresses increase of capacitance between lines is provided.

DESCRIPTION OF EMBODIMENTS

Figure 1:
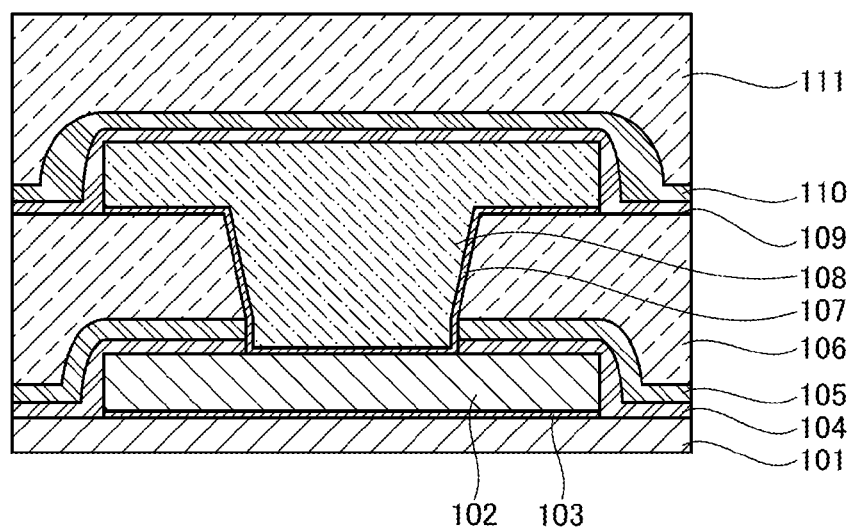
FIG. 1 is a cross-sectional view of a line structure including a connection hole in an embodiment according to the present invention.

Hereinafter, embodiments according to the present invention will be described. The present invention is not limited to the following embodiments, and the embodiments may be modified as necessary. In the drawings, width, length, thickness or the like may be shown with emphasis, and may be different from those in actual cases of carrying out the present invention. The film thicknesses, materials, conditions and the like described below regarding film formation are examples, and may be changed as necessary.

Embodiment 1

FIG. 1 is a cross-sectional view of a line structure in an embodiment according to the present invention. The cross-sectional view shown in FIG. 1 includes a cross-sectional view of a connection hole provided to connect a line in a first layer (lower layer) and a line in a second layer (upper layer) to each other. The connection hole is located in an area where the first layer line and the second layer line overlap each other. A part of the second layer line that is located in the connection hole will be occasionally referred to as a "via connection part".

As shown in FIG. 1, a line material 102 is located on a substrate (plate) 101. There is no specific limitation on the material of the substrate 101. The substrate 101 may be formed of, for example, a semiconductor such as silicon or the like, glass and the like. In the case where the substrate 101 is formed of silicon, it is preferable that a silicon oxide film is formed as an insulating film on the silicon substrate. There is no specific limitation on the thickness of the substrate 101. For example, the thickness of the substrate 101 may be set to a range of 300 μm or greater and 1000 μm or less. In the case where a support substrate (not shown) is used below the substrate 101, a substrate having a thickness in the range of 10 μm or greater and 100 μm or less may be used as the substrate 101. Alternatively, the substrate 101 may have a layer structure, and one or a plurality of layers in the layer structure may have a line already formed therein.

The line material 102 forms the first layer line. The line material 102 is formed of a conductive material such as Au, Al, Cu or the like. Among these materials, Cu, which is highly conductive and costs low, is preferably used. There is no specific limitation on the thickness of the line material 102. The line material 102 has a thickness of, for example, about 4 μm. It is preferable that a barrier metal 103 is located between the substrate 101 and the line material 102. This prevents the metal forming the line material 102 from being diffused to the substrate 101. The barrier metal 103 may be formed of a high-melting-point metal material or a compound thereof. Such a high-melting-point metal material or a compound thereof has a melting point higher than a temperature at which an organic insulating material usable to form an organic resin film is thermally cured. The melting point of the high-melting-point metal material or a compound thereof is 1500° C. or higher. Examples of the high-melting-point metal material or a compound thereof usable for the barrier metal 103 include Ti, TiN, Ta, TaN, and the like.

On a top surface of the substrate 101 and on a top surface and a side surface of the line material 102, an inorganic film is located. The inorganic film forms an insulating film that is located in an area other than in the connection hole provided to connect the first layer line and the second layer line to each other. The inorganic film is formed of a single layer or a plurality of layers. Preferably, the inorganic film includes a stack of a plurality of inorganic films of different materials. In FIG. 1, the inorganic film includes a first inorganic film 104 and a second inorganic film 105 formed on the first inorganic film 104.

The first inorganic film 104 is formed of, for example, silicon nitride and produced by a plasma CVD method. The second inorganic film 105 is formed of, for example, silicon oxide and produced by a plasma CVD method. The top surface and the side surface of the line material 102 are covered with the silicon nitride film, and thus atoms, molecules or ions of the line material 102 can be prevented from being diffused. The barrier metal 103 is located on a bottom surface of the line material 102, and this can also prevents the atoms, molecules or ions of the line material 102 from being diffused. Each of the first inorganic film 104 and the second inorganic film 105 may have a thickness properly selected such that a desired insulating property is provided. The thickness of the first inorganic film 104 may be 0.1 μm, and the thickness of the second inorganic film 105 may be 2 μm.

On the second inorganic film 105, an organic resin film 106 formed of an organic resin material is located. The organic resin film 106 forms an insulating film located in an area other than in the connection hole provided to connect the first layer line and the second layer line to each other. The organic resin film 106 may be formed of, for example, polyimide. An organic material such as polyimide or the like has a dielectric constant lower than that of an inorganic material of a P—SiN film or a P—SiO$_2$ film formed by a plasma CVD method. Therefore, such an organic material can decrease the line capacitance between the plurality of lines in a plurality of layers and can decrease the delay of signals transmitted through the lines. The organic resin film 106 may have a thickness properly selected such that a desired insulating property is provided. It is preferable that the thickness of the organic resin film 106 is adjusted such that the thickness of the organic resin film 106 is 20% or greater and 80% or less of a total thickness of the first inorganic film 104, the second inorganic film 105 and the organic resin film 106 in an area on the second inorganic film 105 above the line material 102. In this manner, both of the size reduction and reducing an adverse effect on the surrounding of the organic resin film 106 due to thermal expansion of the organic resin film 106 can be provided to a certain degree. The reason is as follows. The dielectric constant of an inorganic material is generally higher than that of an organic material. Therefore, when the thickness of the organic resin film 106 is lower than 20% of the total thickness of the films 104, 105 and 106, a parasitic capacitance is increased by size reduction. The thermal expansion coefficient of an organic material is higher than that of the line material. Therefore, when the thickness of the organic resin film 106 is higher than 80% of the total thickness of the films 104, 105 and 106, the ratio of occurrence of voids by thermal expansion is increased. For example, the thermal expansion coefficient (linear expansion coefficient) of a P—SiO$_2$ film is 0.5 to 2 E-6/K, which is about 1/10 to 1/100 of that of an organic resin film.

It is preferable that the material forming the organic film 106 has a dielectric constant lower than that of each of the material forming the first inorganic film 104 and the material forming the second inorganic film 105. This can suppress the line capacitance between the lines from being increased. The dielectric constant of the material forming the first inorganic film 104 and that of the material forming the second inorganic film 105 may be equal to each other, the former may be higher than the latter, or the former may be lower than the latter.

Specific values of the dielectric constant of the materials are as follows. In the case where polyimide is used as the material of the organic resin film 106, it is preferable that the dielectric constant of the polyimide is 3.5 or lower. A reason for this is that the dielectric constant of P—SiN, which is an example of the material usable to form the first inorganic film 104, is usually 7.0, and the dielectric constant of P—SiO$_2$, which is an example of the material usable to form the second inorganic film 105, is usually 4.1. In the case where P—SiN is used as the material of the first inorganic film 104 and P—SiO$_2$ is used as the material of the second inorganic film 105, the dielectric constant of the material forming the first inorganic film 104 is higher than that of the material forming the second inorganic 105. Therefore, in this case, it is preferable that the thickness of the first inorganic film 104 is small, and is, for example, smaller than the thickness of the second inorganic film 105, from the point of view of suppressing the increase of the line capacitance.

In the case where a P—SiN film is used as the first inorganic film 104, a P—SiO$_2$ film is used as the second inorganic film 105, and a polyimide film is used as the organic resin film 106, the thicknesses of the films may be, for example, 0.1 μm, 2.0 μm and 8.0 μm (which are thicknesses of each film on the lines), respectively. Therefore, in this case, the thickness of the P—SiO$_2$ film is 25% of the thickness of the polyimide film. Polyimide is thermally contracted by about 15% when being thermally treated to be cured. Therefore, polyimide is applied so as to have a thickness of 9.4 μm above the line in consideration of such thermal contraction. The thickness of the line material 102 may be 0.4 μm. In this case, the total thickness of the polyimide and the line material 102 is 13.4 μm. The first inorganic film 104 and the second inorganic film 105 each have the same thickness in a part above the line and the remaining part. Therefore, the thicknesses of the first inorganic film 104 and the second inorganic film 105 may be ignored.

The connection hole through which the first layer line and the second layer line are connected to each other is formed as follows. In the organic resin film 106, the second inorganic film 105 and the first inorganic film 104, a via connection hole is formed having a bottom part reaching the line material 102. On a bottom surface and a side surface of the via connection hole (an inner wall of the via connection hole), a barrier metal film 107 is formed as a barrier conductive layer. On the barrier metal film 107, a line material 108 is located. The barrier metal film 107 may be formed of a high-melting-point metal material or a compound thereof. The barrier metal film 107 may be formed of, for example, Ti, TiN, Ta, TaN, or the like. The line material 108 forms a line in the upper layer, i.e., forms the second layer line. Namely, the line material 108 forms a line located in a layer different from the layer in which the line material 102 is located.

The polyimide film may be formed by spin coating or film bonding. However, there is a limit on the thickness of the film. In the case where, for example, spin coating or film bonding is used, about 20 μm is the upper limit of the thickness. By contrast, there is no limit on the thickness of the P—SiO$_2$ film. Therefore, when the connection hole does not have a sufficient height, the height of the connection hole can be adjusted by the thickness of the P—SiO$_2$ film. In this manner, the line capacitance between the lower layer line and the upper layer line can be controlled, and the impedances can be matched among the lines.

In the case where a silicon wafer is used as the substrate 101, the wafer may be warped because the organic resin and the Cu lines have a tensile stress. The degree of warp is raised as the number of the layers of lines is increased, and the substrate 101 may become unsuitable to be treated with an exposure device or a plasma CVD device. After an interposer is removed from the wafer and the wafer is put into individual chips, the substrate 101 is still warped. As a result, a flaw may occur during a process of stacking the chips on each other or a process of bonding the chips to a motherboard. This problem is solved by providing the P—SiO$_2$ with a compressive stress so that the compressive stress is well balanced with the tensile stress of the organic resin or the Cu lines.

As described above, the P—SiO$_2$ film having a lower thermal expansion coefficient that that of the organic resin is located below the organic resin film 106, and thus the tensile stress caused when Cu is provided in the connection hole can be decreased. For example, the distance between the upper layer line and the lower layer line, namely, the height of the connection hole is set to 10 μm, and a P—SiO$_2$ film having a thickness of 2 μm is formed in an area corresponding to the distance of 10 μm. An area corresponding to the remaining 8 μm is filled with the organic resin film. The tensile stress in this state is lower by 20% than that in the case where the area corresponding to 10 μm is fully filled with the organic resin film.

The above value is simply calculated from the difference in the thermal expansion coefficient. The tensile stress is further decreased when an action caused by a strong adhesive force between a material of the barrier metal film 107 containing Ti or Ta that is formed on the side surface of the connection hole and P—SiO$_2$ (the adhesive force is 800 N/cm or greater; by contrast, the material of the barrier metal layer 107 and polyimide have an adhesive force of 300 N/m or less), and caused by a high elastic modulus of P—SiO$_2$ (40 GPa or greater; by contrast, polyimide has an elastic modulus of 3 to 7 GPa), is added. During the formation of the lines, polyimide, located in the layer having the lines formed therein by a high-temperature treatment, has a property of being elastically deformed by thermal expansion. However, the elastic deformation does not easily occur because P—SiO$_2$ located to sandwich the polyimide has a high elastic modulus. This further decreases the tensile stress in the connection hole.

A top surface and a side surface of the line material 108 is covered with an inorganic material, like the line material 102. For example, a first inorganic film 109 is located on the top surface and the side surface of the line material 108, and a second inorganic film 110 is located on the first inorganic film 109. On the second inorganic film 110, an organic resin film 111 is located.

A part of the line material 108 that is not in contact with the barrier metal and the top surface and the side surface of the line material 102 are covered with a plasma nitride film (P—SiN film), and thus atoms, molecules or ions of the line material 102 and the line material 108 can be prevented from being diffused in the organic resin films 106 and 111. The barrier metal film 107 on the bottom surface and the side surface of the connection hole can also prevent atoms, molecules or ions of the line material 108 from being diffused in the organic resin film 106 by heat or the like.

Silicon oxide is used as a material of the second inorganic film 105, and thus the adhesiveness thereof with the barrier metal located on an inner surface of the connection hole is increased and thus occurrence of a disconnecting can be suppressed. In this case, the second inorganic film 105 is made thicker than the first inorganic film 104, so that the adhesiveness between the second inorganic film 105 and the barrier metal can be increased. In the case where a P—SiN film is used as the first inorganic film 104, the thickness of the second inorganic film 105 is made substantially equal to that of the first inorganic film 104, so that the adhesiveness between the second inorganic film 105 and the barrier metal can be further increased.

Side surfaces of the upper layer line and the lower layer line formed of the line material 108 and the line material 102 do not need to be covered with a barrier metal. In general, a barrier metal has a resistance value higher than that of a line material such as Cu or the like. When a barrier metal is used excessively, the resistance value of the lines is increased. In this embodiment, the side surfaces of the lines formed of the line material 108 and the line material 102 do not need to be covered with a barrier metal. Therefore, the resistance value of the lines can be suppressed from being increased.

It is assumed that, for example, a line has a width of 1 μm. If a barrier metal having a thickness of 0.1 μm is located at side surfaces of the line, the barrier metal occupies 20% of the cross-sectional area of the line. Therefore, the resistance of the line is increased by 20% than that in the case where the barrier metal is not located. The degree of such increase of the resistance of the line is raised as the width of the line is decreased.

It is considered that such an increase of the resistance of the line can be avoided by decreasing the thickness of the barrier metal. However, when the thickness of the barrier metal is decreased, the barrier metal is oxidized in a thickness direction thereof by oxygen diffusing from the insulating film around the barrier metal. This lowers the level of barrier performance of the barrier metal. By contrast, P—SiN is stable against oxygen. Therefore, even when the side surfaces of the line are covered with P—SiN as in this embodiment, the P—SiN is not deteriorated. As can be seen, according to this embodiment, the increase of the resistance of the line can be suppressed, even when the size of the line is reduced and thus the width of the line is decreased.

With reference to FIGS. 2A to 2J and FIG. 3, a method for producing a line structure in this embodiment will be described.

Figure 2A:
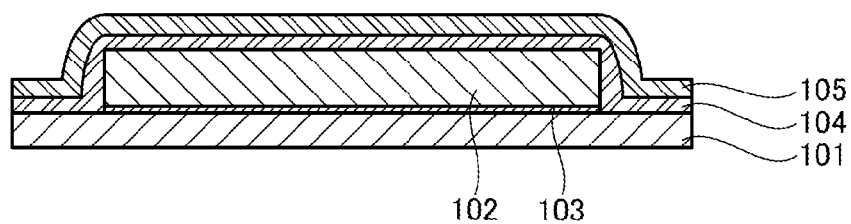
FIG. 2A shows a method for producing the line structure in the embodiment according to the present invention.

First, as shown in FIG. 2A, the barrier metal 103 is located on a part of the substrate 101 where the line material 102 is to be located. The line material 102 is located thereon by electrolytic plating so as to have a thickness of, for example, 4 μm. The first inorganic film 104 having a thickness of 0.1 μm and the second inorganic film 105 having a thickness of 2.0 μm are formed sequentially.

Figure 2B:
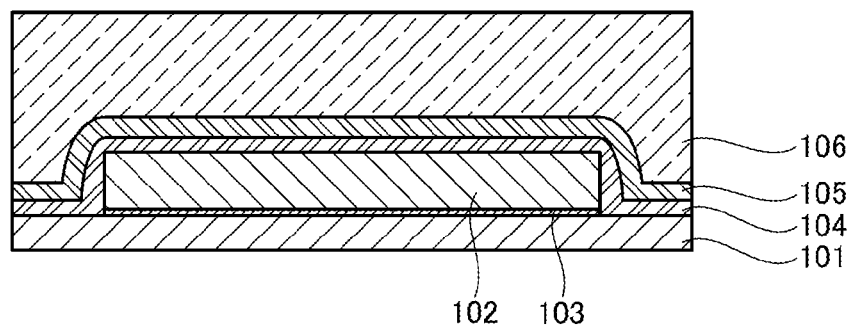
FIG. 2B shows a method for producing the line structure in the embodiment according to the present invention.

Next, as shown in FIG. 2B, an organic resin material such as photosensitive polyimide or the like is applied onto the second inorganic film 105 by a spin coating method or the like so as to have a thickness of, for example, 15 μm. Thus, the organic resin film 106 is formed. An opening 106a is formed in the organic resin film 106 by lithography. The opening 106a is to be a part of the via connection hole.

Figure 3:
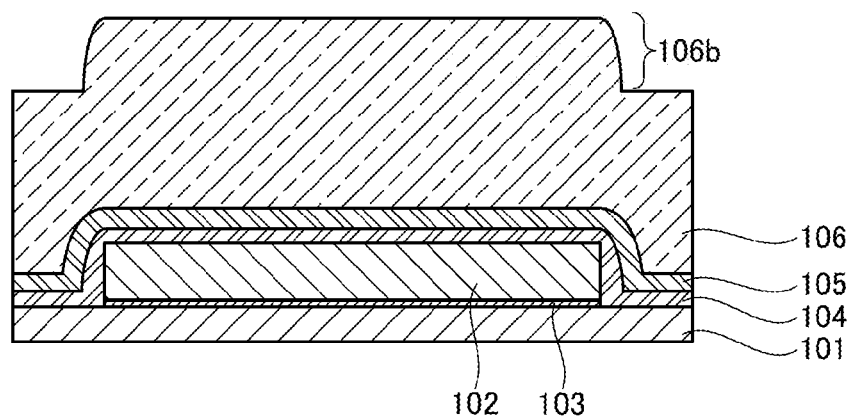
FIG. 3 shows the method for producing the line structure in the embodiment according to the present invention.

After the opening 106a is formed, the organic resin film 106 is thermally cured. As shown in FIG. 3, when the organic resin film 106 is thermally cured, a top part 106b of the organic resin film 106 may protrude by the presence of the line material 102 and the thermal contraction of the organic resin material. When this occurs, the top surface is flattened by use of a fly cutter or the like. Alternatively, in order to avoid the top part of the organic resin film 106 from protruding like this, the organic resin film 106 may be formed of an organic resin material having a low thermal contraction coefficient.

Figure 2C:
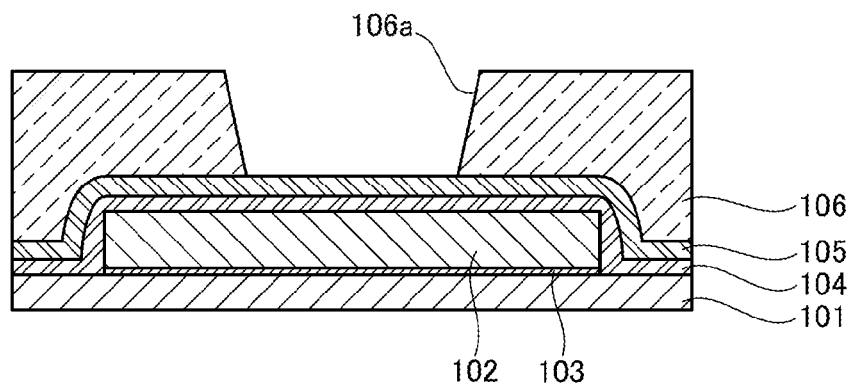
FIG. 2C shows a method for producing the line structure in the embodiment according to the present invention.
Figure 2D:
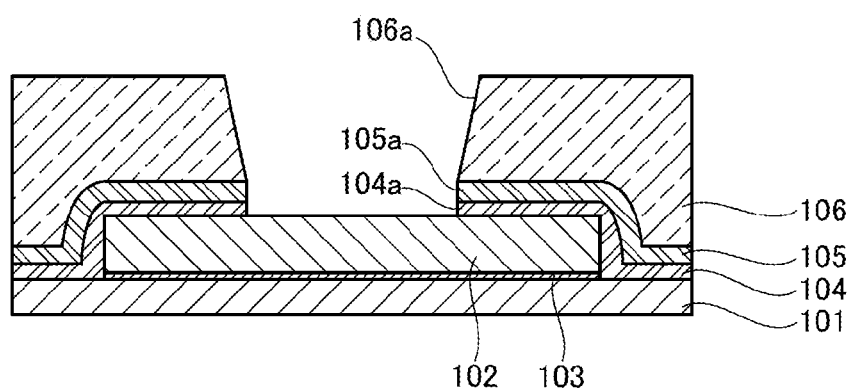
FIG. 2D shows a method for producing the line structure in the embodiment according to the present invention.

Next, as shown in FIG. 2D, the via connection hole running through the second inorganic film 105 and the first inorganic film 104 and having a bottom part reaching the line material 102 is formed by etching, with the organic resin film 106 being used as a mask. As a result, the via connection hole runs through an insulating film including the organic resin film 106, the second inorganic film 105 and the first inorganic film 104 in an up-down direction. The opening 106a does not need to be formed at a position other than a position where the via connection hole is to be formed. Polyimide has an upper limit of photosensing resolution of 0.5 μm. Therefore, it is considered that the via connection hole has a diameter of 0.5 μm at the minimum.

Figure 2E:
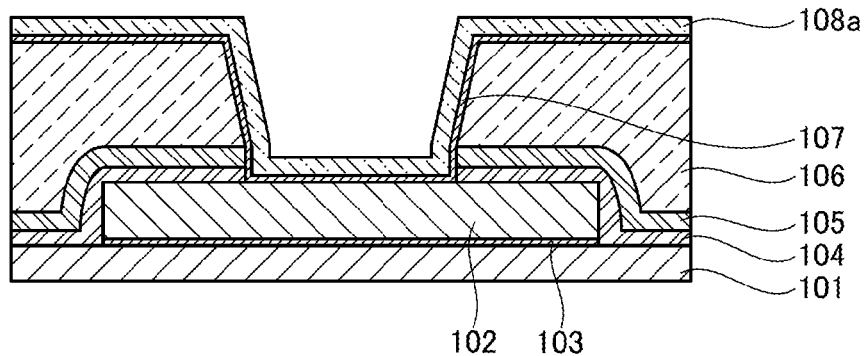
FIG. 2E shows the method for producing the line structure in the embodiment according to the present invention.

Next, as shown in FIG. 2E, the barrier metal film 107 is formed on a top surface of the organic resin film 106 including an inner surface of the opening 106a, and a Cu film 108a is formed thereon. At this point, it is preferable to put the barrier metal film 107 and the second inorganic film 105 into contact with each other. A reason for this is that when the adhesiveness between the barrier metal film 107 and the second inorganic film 105 is high, occurrence of a disconnecting can be suppressed.

Figure 2F:
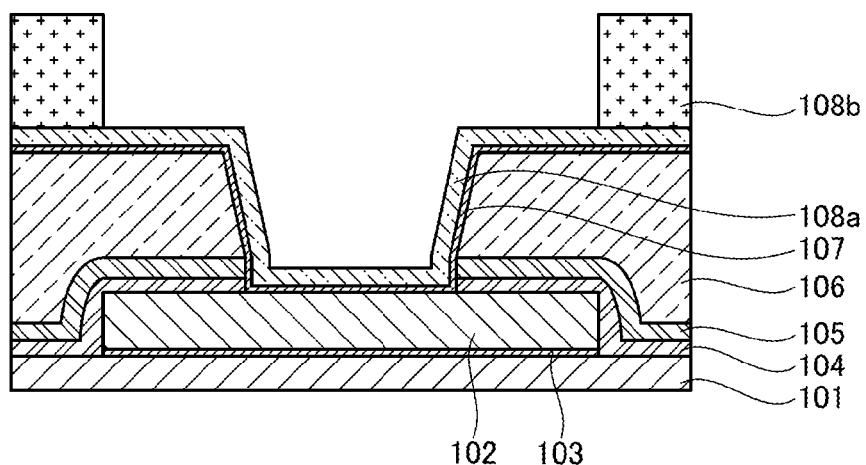
FIG. 2F shows the method for producing the line structure in the embodiment according to the present invention.

Next, a photoresist is applied onto the Cu film 108a, and exposure and development are performed to form a line pattern 108b as shown in FIG. 2F.

Figure 2G:
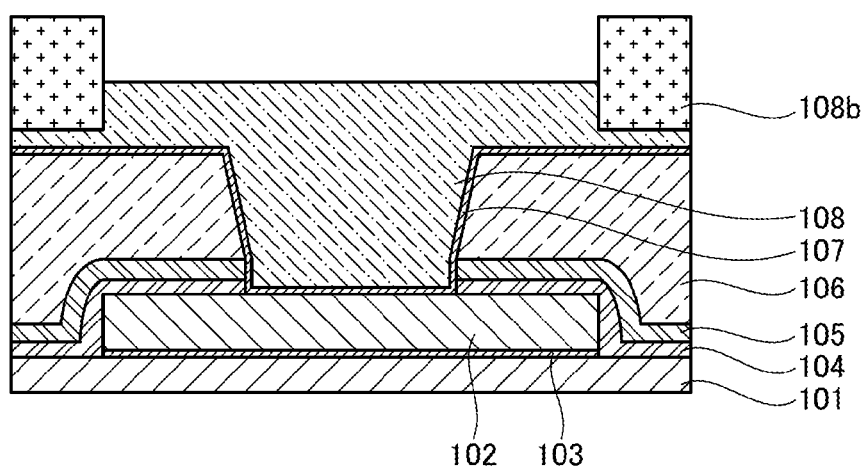
FIG. 2G shows the method for producing the line structure in the embodiment according to the present invention.

Next, Cu is grown by electrolytic plating on a part of the Cu film 108a that is not covered with the line pattern 108b. As shown in FIG. 2G, the via connection hole and a part inner to the line pattern 108b are filled with Cu as the line material 108. Thus, the via connection part is formed in the connection hole, and also an upper layer line is formed on the via connection part.

Figure 2H:
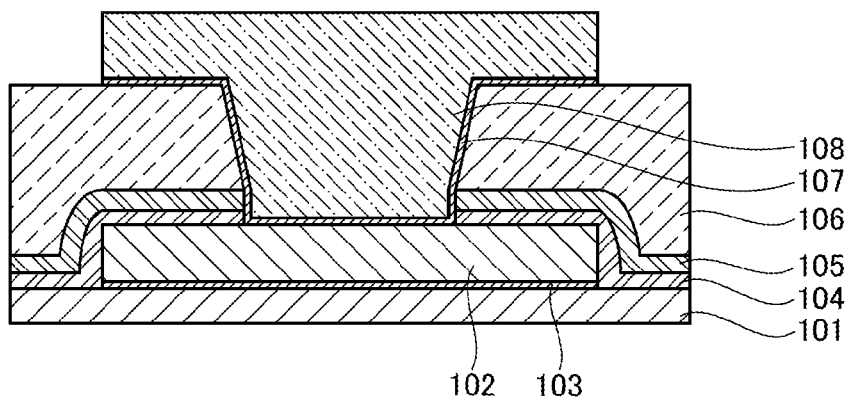
FIG. 2H shows the method for producing the line structure in the embodiment according to the present invention.

Next, the line pattern 108b is removed, and a part of the Cu film 108a that is exposed by the removal of the line pattern 108b and a part of the barrier metal film 107 below the exposed part of the Cu film 108a are removed with an acidic aqueous solution or the like. As a result, a structure shown in FIG. 2H is obtained.

Figure 2I:
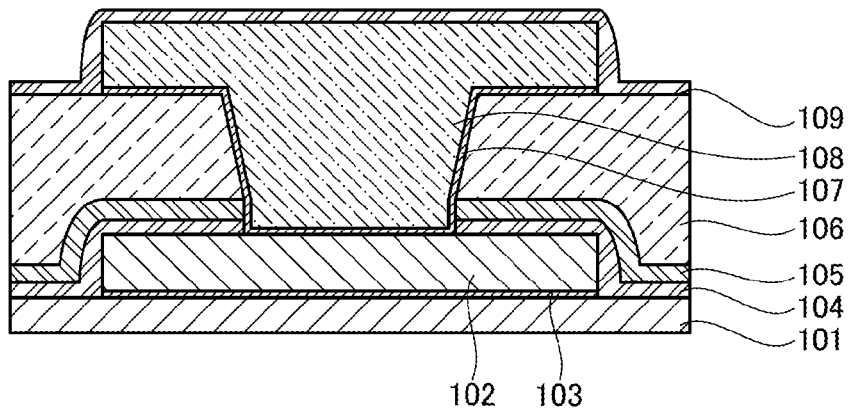
FIG. 2I shows the method for producing the line structure in the embodiment according to the present invention.
Figure 2J:
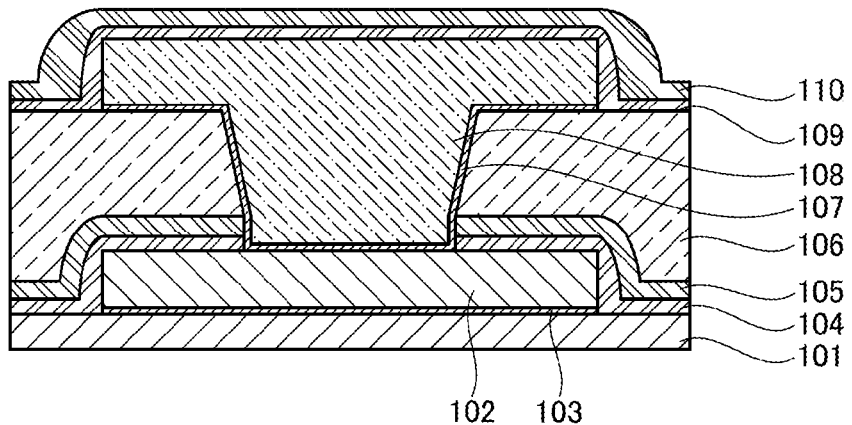
FIG. 2J shows the method for producing the line structure in the embodiment according to the present invention.

Then, as shown in FIG. 2I, the first inorganic film 109 is formed so as to cover the organic resin film 106 and the line material 108. Then, as shown in FIG. 2J, the second inorganic film 110 is formed.

In the case where another line is to be formed on the upper layer line formed of the line material 108, the process in FIG. 2A and thereafter is performed again, with the line material 108 being regarded as the line material 102, the first inorganic film 109 being regarded as the first inorganic film 104, and the second inorganic film 110 being regarded as the second inorganic film 105.

In this embodiment, the side surface of the line material 102, for example, does not need to be covered with a barrier metal. Therefore, the increase of the resistance value of the lines can be suppressed. Since the side surface of the line material 102, for example, is covered with the first inorganic film 104, atoms or the like of the line material 102 can be suppressed from being diffused. In the case where the adhesiveness between the barrier metal formed on the inner surface of the connection hole and the inorganic film (e.g., P—SiN film) is high, a disconnecting in the connection hole, which would be caused by thermal expansion of the organic resin film 106, can be suppressed from occurring. Since a photosensitive material is used as a material of the organic resin film 106, the opening 106a can be formed in the organic resin film 106 and the organic resin film 106 can be used as a mask for forming an opening in the first inorganic film 104 and the second inorganic film 105. This can simplify the method.

As described above, the minimum value of the diameter of the via connection hole is considered to be 0.5 μm, and the width of each line has a small value of 0.5 μm at the minimum. In this embodiment, the side surfaces of the lines do not need to be covered with a barrier metal. Therefore, even though the width of each line is 0.5 μm, the increase of the resistance of the lines can be suppressed.

Embodiment 2

Figure 4:
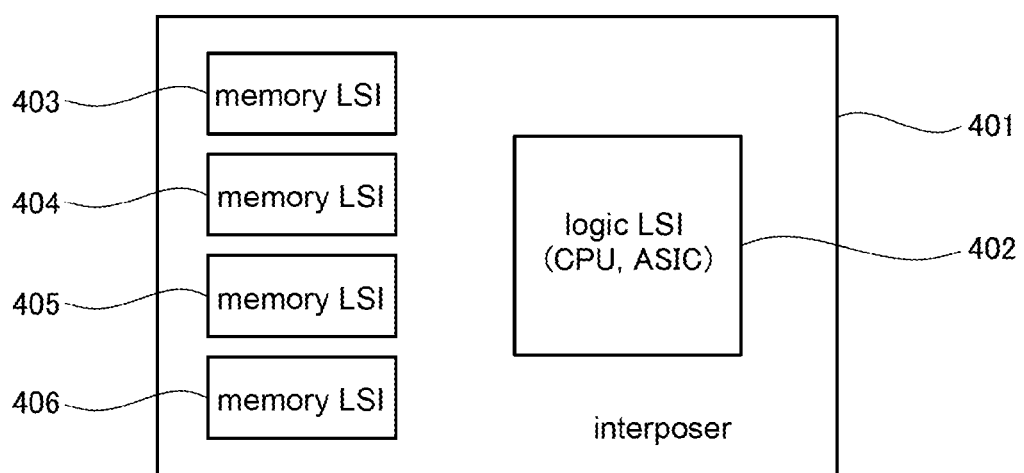
FIG. 4 shows an example of structure including LSI chips arranged by use of line structure in an embodiment according to the present invention.

FIG. 4 shows an example of arrangement of LSI chips made by use of line structures according to embodiment 2 of the present invention. This is an example of arrangement called a "2.5-dimensional mounting".

In FIG. 4, an interposer 401 is a multi-layer line structure in this embodiment. On the interposer 401, a logic LSI 402 such as a CPU (Central Processing Unit), an ASIC (Application Specific Integrated Circuit) or the like and memory LSIs 403, 404, 405 and 406 such as a DRAM, a flash memory or the like are located, and are connected together via lines in the interposer 401. Because of this arrangement, signal lines, power supply lines and ground lines can be connected together with a short distance between the memory LSIs 403, 404, 405 and 406 and the logic LSIs 402. Therefore, a high-speed process can be performed as a whole.

With reference to FIGS. 5A to 5L, a method for producing a line structure as the interposer 401 in this embodiment will be described.

Figure 5A:
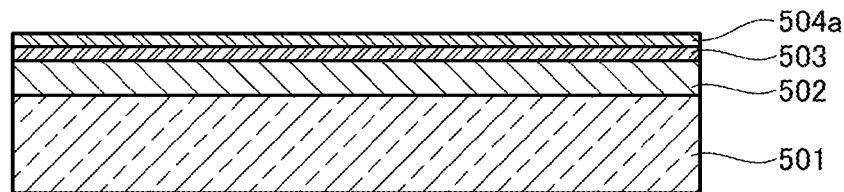
FIG. 5A shows a method for producing the line structure in the embodiment according to the present invention.

As shown in FIG. 5A, on a substrate 501 such as a silicon substrate or the like, an $SiO_2$ film (P—$SiO_2$ film) 502 having a thickness of 3 μm is formed by plasma CVD. Next, a Ti film 503 having a thickness of 0.1 μm and a Cu film 504a having a thickness of 0.3 μm are formed by sputtering. The Ti film 503 acts as a barrier metal film for preventing Cu from being diffused to the substrate 501. The Cu film 504a acts as a seed from which Cu is grown by electrolytic plating. In this example, TiN or Ta, which is a high-melting-point metal material, for example, may be used as a material of the barrier metal instead of Ti.

Figure 5B:
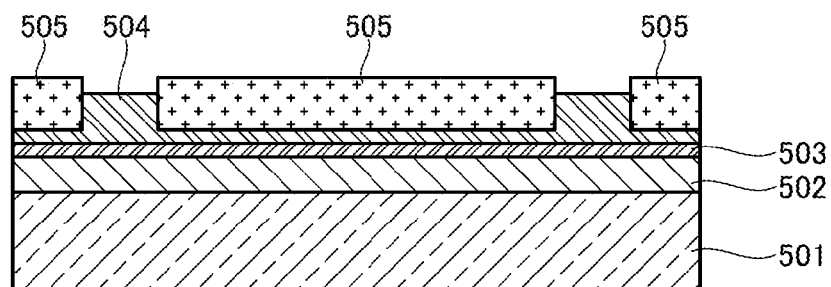
FIG. 5B shows a method for producing the line structure in the embodiment according to the present invention.

Next, as shown in FIG. 5B, a photoresist is applied onto the Cu film 504a, and exposure and development are performed to form a line pattern 505. Then, a Cu film 504 is grown on a part of the Cu film 504a that is exposed from the line pattern 505 by electrolytic plating so that the Cu film 504 has a thickness of 4.4 μm. In this embodiment, Cu in the Cu film 504, 504a is used as the material of a first layer line, and the first layer line is designed to have a thickness of 4.0 μm.

Figure 5C:
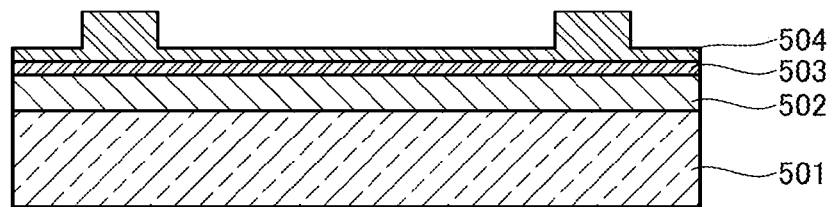
FIG. 5C shows a method for producing the line structure in the embodiment according to the present invention.

Next, after the Cu is grown, the photoresist forming the line pattern 505 is removed with an organic solvent. As a result, a structure shown in FIG. 5C is obtained. The photoresist may be removed by ashing with oxygen plasma instead of with an organic solvent.

Figure 5D:
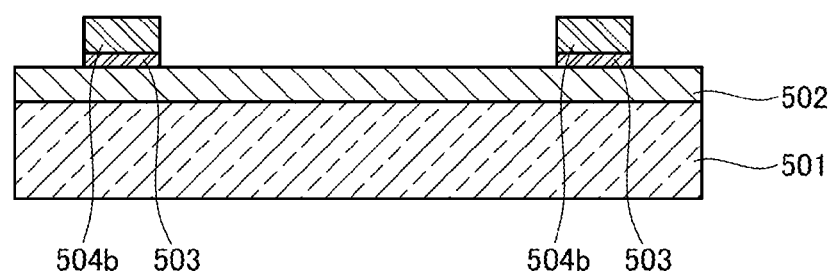
FIG. 5D shows a method for producing the line structure in the embodiment according to the present invention.

Next, as shown in FIG. 5D, a part of the Cu film 504a and a part of the Ti film 503 that were covered with the line pattern 505 are removed with an acidic aqueous solution to form Cu lines 504b in the first layer. As a result of the part of the Cu film 504a that was covered with the line pattern 505 being removed, the thickness of the Cu film 504 is decreased from 4.4 μm to about 4.0 μm. Thus, the designed value can be achieved. The Cu film 504a and the Ti film 503 may be removed by ion milling instead of with an acidic aqueous solution.

Figure 6:
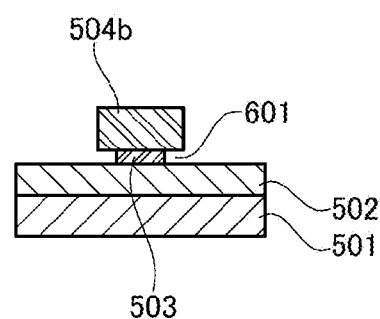
FIG. 6 shows the method for producing the line structure in the embodiment according to the present invention.

In the case where an acidic aqueous solution is used, as shown in FIG. 6, a large undercut 601 is formed. Especially when the width of each of the Cu lines is 5 μm or less, the Cu lines 504b and the underlying layer may not have a sufficiently high adhesiveness therebetween, and as a result, the Cu lines may be peeled off by a stress thereof. By contrast, in the case where ion milling is used, such an undercut is not likely to be formed. Therefore, microscopic lines can be formed.

Figure 5E:
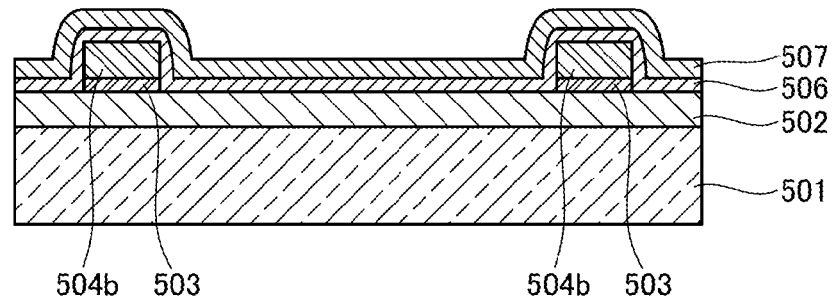
FIG. 5E shows a method for producing the line structure in the embodiment according to the present invention.

Next, as shown FIG. 5E, a P—SiN film 506 having a thickness of 0.1 μm is formed by plasma CVD on the Cu lines 504b in the first layer, and then a P—$SiO_2$ film 507 having a thickness of 2 μm is formed thereon. For forming the P—SiN film 506, $SiH_4$ is usable as a source of Si and $NH_3$ is usable as a source of nitrogen. For forming the P—$SiO_2$ film 507, $SiH_4$ is usable as a source of Si and $N_2O$ is usable as a source of oxygen. As a source of Si, tetraethoxysilane (TEOS) is also usable. As a source of oxygen, $O_2$ is also usable. It can be considered that the structure shown in FIG. 2A is included in the structure shown in FIG. 5E.

In order to suppress the warp of the wafer used as the substrate 101, it is preferable to adjust P—$SiO_2$ to have a compressive stress of −100 to −300 MPa as a film stress. It is especially preferable to adjust the film stress to −200 MPa.

If copper oxide is present on surfaces of the Cu lines 504b in the first layer, the adhesive force between P—SiN and Cu is decreased. Therefore, it is preferable to wash the lines 504b with diluted sulfuric acid or the like before the P—SiN film 506 is formed. Alternatively, before the P—SiN film 506 is formed, the surfaces of the Cu lines 504b may be subjected to $NH_3$ plasma in the same chamber as that to be used for the formation of the P—SiN film 506, so that the copper oxide is removed.

The P—SiN film 506 acts as a barrier film for preventing Cu atoms, Cu molecules or Cu ions of the Cu lines 504b from being thermally diffused to the P—$SiO_2$ film 507 from side surfaces or the top surfaces of the Cu lines 504b, and for also preventing diffusion from occurring due to an electric field between lines adjacent to each other. SiC (which may contain several to 10% of oxygen) may be used as a barrier insulating film instead of P—SiN. The SiC film can be formed by plasma CVD, and has an effect of preventing the diffusion of the Cu atoms, Cu molecules or Cu ions of the Cu lines 504*b*.

An SiOC film, an SiOF film or the like may be formed instead of the P—SiO$_2$ film 507. The SiOC film and the SiOF film can be formed by plasma CVD. SiOC and SiOF each have a dielectric constant lower than that of P—SiO$_2$, and thus can decrease the line capacitance between lines adjacent to each other.

Next, polyimide is applied onto the P—SiO$_2$ film 507 by spin coating so as to have a thickness of 9.4 μm above the lines. Bisbenzocyclobutene may be applied instead of polyimide. Alternatively, a non-photosensitive resin may be used. In the case where a non-photosensitive resin is used, however, a photosensitive resin needs to be applied to perform patterning by lithography. Therefore, use of a non-photosensitive resin may increase the number of steps of production. In the following example, polyimide, which is photosensitive, is applied.

Figure 5F:
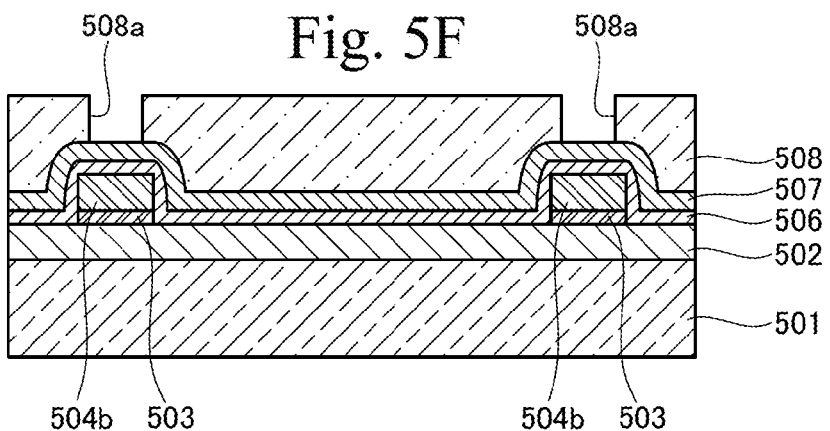
FIG. 5F shows the method for producing the line structure in the embodiment according to the present invention.

In the case where a photosensitive polyimide 508 is applied, exposure and then development are performed by use of a photomask to form, as shown in FIG. 5F, opening patterns 508*a* at necessary positions above the Cu lines 504*b*. The "necessary positions" are positions where the Cu lines 504*b* need to be connected to lines which will be formed in a layer above the Cu lines 504*b*. It can be considered that the structure shown in FIG. 2C is included in the structure shown in FIG. 5F.

In order to cure the applied polyimide after the opening patterns 508*a* are formed, the polyimide is thermally cured at a temperature of 250° C. for 1 hour in an N$_2$ atmosphere. The temperature is not limited to 250° C. In general, it is preferable to set the temperature at a glass transition temperature of polyimide or lower. A reason for this is that if the polyimide is cured at a temperature higher than the glass transition temperature, each of the openings 508*a* is deformed, resulting in a problem that, for example, the diameter of the opening is larger than the designed size. Assuming that the glass transition temperature of polyimide is, for example, 280° C., the thermal-curing temperature is set to 250° C. as described above. It is preferable that the thermal curing treatment and the process in steps after this are performed such that the temperature does not exceed the glass transition temperature of polyimide.

Figure 7:
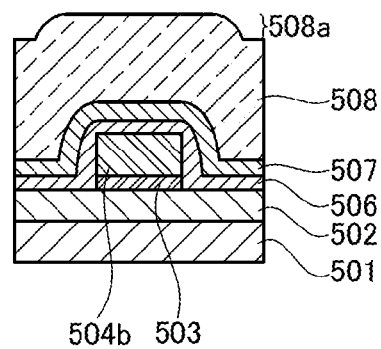
FIG. 7 shows the method for producing the line structure in the embodiment according to the present invention.

When the polyimide is thermally cured, a stepped portion 508*b* as shown in FIG. 7 may be formed at a surface of a part of the photosensitive polyimide 508 other than in the openings 508*a* due to convexed and concaved portions caused by the Cu line 504. Unless being treated in some way, the size of the stepped portion is increased as more lines are stacked. This causes a focus shift at the time of pattern exposure. When this occurs, it becomes difficult to form a line pattern in accordance with the designed size. As a result, a desired contact resistance may not be provided, or shortcircuit may occur because of adjacent lines being connected. In order to decrease the size of such a stepped portion, it is preferable to use polyimide having a low thermal expansion coefficient (preferably, 15% or less). In order to remove the convexed and concaved portions at the surface of the polyimide at high precision, a fly cutter may be used. Alternatively, the convexed and concaved portions can be removed also by chemical mechanical polishing (CMP).

Next, a part of the P—SiO$_2$ film 507 that is located in bottom parts of the openings 508*a* is etched away by plasma etching, with the photosensitive polyimide 508 being used as a mask. As an etching gas, a mixed gas of CF$_4$ (flow rate: 20 sccm) and H$_2$ (flow rate: 5 sccm) may be used. The flow rate ratio of the materials of the mixed gas may be changed so that the etching rate for each of the cured photosensitive polyimide 508 and the P—SiO$_2$ film 507 can be changed. It is preferable that the etching rate for the P—SiO$_2$ film 507 is high and the etching rate for the photosensitive polyimide 508 is low. In general, the ratio of the etching rate for P—SiO$_2$ with respect to the etching rate for polyimide is about 5, and the ratio of the etching rate for P—SiO$_2$ with respect to the etching rate for P—SiN is about 8. The etching gas is not limited to the above-described gas, and may be CHF$_3$ or CH$_2$F$_2$ instead of CF$_4$.

After the P—SiO$_2$ layer 507 is etched, the etching gas is changed to a mixed gas of CF$_4$ and O$_2$ and the P—SiN layer 506 is etched. At this point, for example, the flow rate of CF$_4$ may be 20 sccm and the flow rate of O$_2$ may be 2 sccm. The ratio of the etching rate for P—SiN with respect to the etching rate for polyimide may be about 2.

As a result of the etching performed on the P—SiN layer 506, first connection holes usable for electrically connecting the Cu lines 504*s* in the first layer to Cu lines in the second layer which will be formed in a later step is formed. In a state immediately after the first connection holes are formed, a carbon compound containing Si of F adheres to side walls or bottom parts of the first connection holes. In order to remove the carbon compound, washing is performed with an organic solvent. A surface of Cu that is exposed at the bottom parts of the first connection holes is in an oxidized state as a result of the plasma etching. In order to remove the oxide formed as a result of the oxidization, washing is performed with dilute sulfuric acid.

As a result of the plasma etching performed on the P—SiO$_2$ layer 507 and the P—SiN layer 506, the surface of the photosensitive polyimide 508 is plasma-damaged, and thus the photosensitive polyimide 508 may not have a sufficient heat resistance, which polyimide should originally have. In this case, a heat treatment may be performed, for example, at a temperature of 250° C. for 30 minutes, so that the plasma-damaged part of the surface can be removed. The temperature of 250° C. is an example of temperature which is lower than, or equal to, the glass transition temperature of polyimide.

Figure 5G:
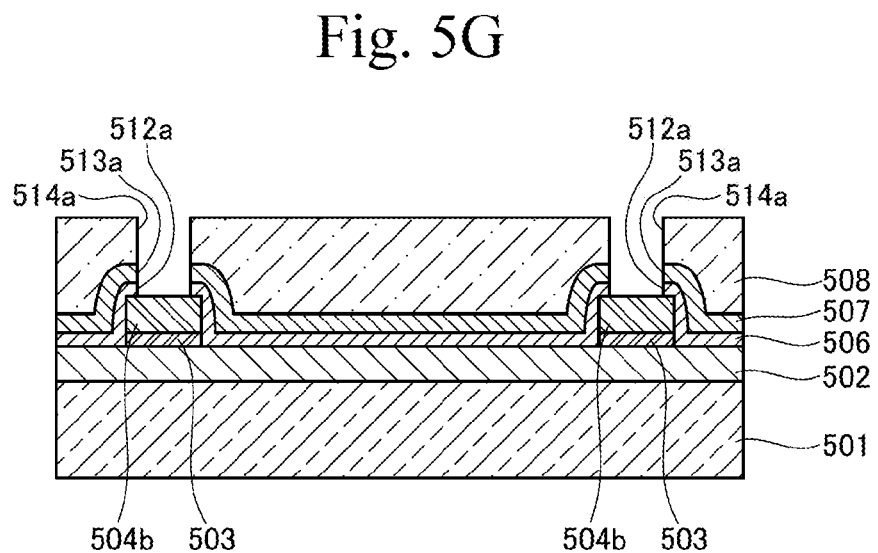
FIG. 5G shows the method for producing the line structure in the embodiment according to the present invention.

As a result of the above-described process, a structure shown in FIG. 5G is obtained. It can be considered that the structure shown in FIG. 2D is included in the structure shown in FIG. 5G.

Next, a Ti film having a thickness of 0.1 μm and a Cu film 509 having a thickness of 0.3 μm are formed by sputtering on the structure shown in FIG. 5G. The Ti film acts as a barrier metal for preventing the diffusion of Cu atoms, Cu molecules or Cu ions of the Cu film 509 as described above. The Cu film 509 acts as a seed from which Cu is grown by electrolytic plating in a later step.

Figure 5H:
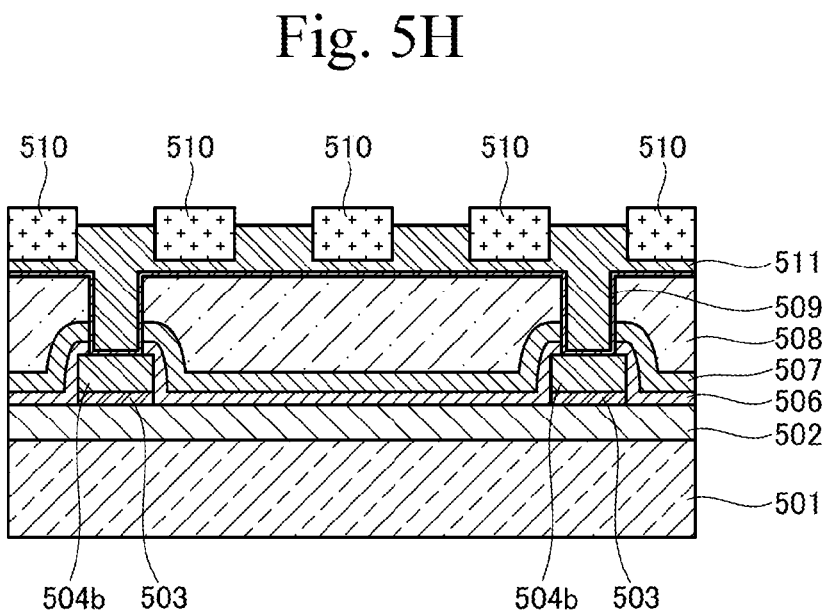
FIG. 5H shows the method for producing the line structure in the embodiment according to the present invention.

As shown in FIG. 5H, a photoresist is applied onto the Cu film 509, and exposure and development are performed to form a line pattern 510. Then, a Cu film 511 is grown by electrolytic plating on a part of the Cu film 509 exposed from the line pattern 510. Assuming that the final thickness of the Cu film 511 from top edges of the first connection holes (namely, the thickness of the Cu lines in the second layer) is 4.0 μm, it is preferable to form the Cu film 511 to have a thickness of 4.4 μm from the top edges of the first connection holes in this step.

Figure 5I:
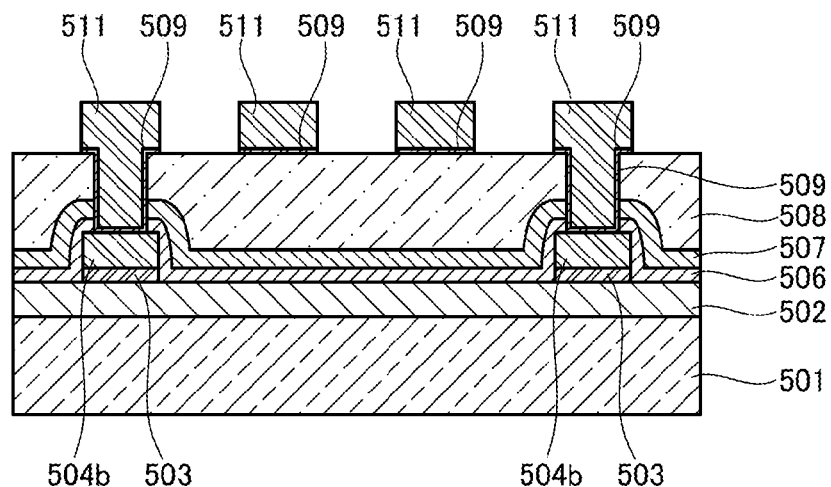
FIG. 5I shows the method for producing the line structure in the embodiment according to the present invention.

Next, as shown in FIG. 5I, after the Cu film 511 is grown, the photoresist forming the line pattern 510 is removed with, for example, an organic solvent. As described above, the photoresist may be removed by ashing with oxygen plasma.

It can be considered that the structure shown in FIG. 2H2H is included in the structure shown in FIG. 5I.

Next, an exposed part of the Cu film 509 and a part of the Ti film below the exposed part of the Cu film 509 are removed with, for example, an acidic aqueous solution to form Cu lines 511 in the second layer. As a result of this step, the thickness of the Cu film 511 is slightly decreased, and thus the designed size can be achieved. Ion milling may be used instead of the acidic aqueous solution.

As a result of the above-described process, the Cu lines 504b in the first layer and the Cu lines 511 in the second layer are connected to each other through via connection parts formed in the first connection holes.

Now, a process of forming Cu lines in a third layer and connecting the Cu lines in the third layer to the Cu lines 511 in the second layer will be described.

Figure 5J:
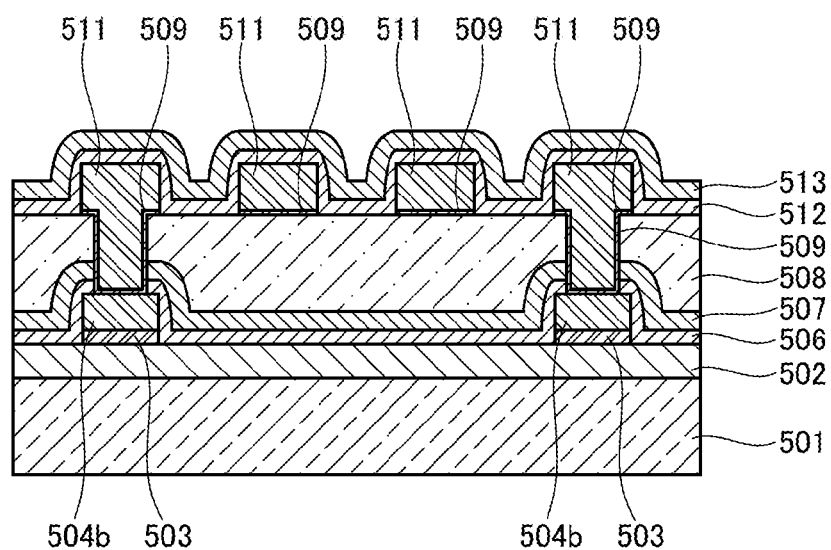
FIG. 5J shows the method for producing the line structure in the embodiment according to the present invention.

As shown in FIG. 5J, a P—SiN film 512 having a thickness of 0.1 μm is formed by plasma CVD on the Cu lines 511, and a P—SiO$_2$ film 513 having a thickness of 2 μm is formed thereon. The reaction system is the same as that used for forming the P—SiN film 506. It is preferable to set the temperature for the film formation to, for example, 250° C. in consideration of the glass transition temperature of polyimide. If the film formation is performed at a temperature exceeding the glass transition temperature of polyimide, the thermal expansion of polyimide is increased. As a result, the photosensitive polyimide 508 may be wrinkled or the P—SiN film 512 or the P—SiO$_2$ film 513 may be cracked due to a difference in the thermal expansion coefficient between polyimide and P—SiN or P—SiO$_2$. It can be considered that the structure shown in FIG. 2J is included in the structure shown in FIG. 5J.

In order to remove copper oxide present on surfaces of the Cu lines 511 in the second layer, the Cu lines 511 in the second layer are washed with diluted sulfuric acid before the P—SiN film 512 is formed. Alternatively, before the P—SiN film 512 is formed, the surfaces of the Cu lines 511 may be subjected to NH$_3$ plasma in the same chamber as that to be used for the formation of the P—SiN film 512, so that the copper oxide is removed. If the surfaces of the Cu lines 511 are exposed to NH$_3$ plasma excessively, the imide bond of the photosensitive polyimide 508 is broken. Therefore, it is preferable that the surfaces of the Cu lines 511 are exposed to NH$_3$ plasma for 30 seconds or shorter, for example, for 20 seconds.

The formation of the P—SiN film 512 is different from the formation of the P—SiN film 506 on the Cu lines 504b in the first layer in that the underlying layer is the photosensitive polyimide 508 instead of P—SiO$_2$. The photosensitive polyimide 508, when being exposed to an acidic aqueous solution for removing the Cu film 509 and the Ti film below the Cu film 509, contains a large amount of water. Even after the Cu film 509 and the Ti film below the Cu film 509 are removed, the photosensitive polyimide 508 has water in the air absorbed thereto. In general, when a P—SiN film is formed on polyimide containing water, the water contained in the polyimide is vaporized to push up the P—SiN film. As a result, the P—SiN film may be peeled off. In order to avoid this, it is preferable to, before the treatment with NH$_3$ plasma, heat the substrate 501 in the same chamber as that to be used for the treatment with NH$_3$ plasma, so that the water contained in the photosensitive polyimide 508 is removed. For example, the treatment with NH$_3$ plasma is performed after degassing is performed for 3 minutes with the substrate temperature in the plasma CVD device being set at 250° C.

Next, photosensitive polyimide is applied onto the P—SiO$_2$ film 513 by spin coating so as to have a thickness of 9.4 μm above the Cu lines. A photosensitive resin such as bisbenzocyclobutene or the like may be applied instead of polyimide as described above. Alternatively, a non-photosensitive resin may be used. In this case, after the non-photosensitive resin is applied, a photosensitive resin is applied to perform patterning by lithography.

Next, the applied photosensitive polyimide is exposed by use of a photomask and development is performed to form opening patterns 514a at necessary positions above the Cu lines 511 in the second layer. After the formation of the opening patterns 514a, the polyimide is thermally cured at a temperature of 250° C. for 1 hour in an N$_2$ atmosphere. Then, the P—SiO$_2$ film 513 and the P—SiN film 512 are etched with the opening patterns 514a being used as a mask. As a result, a structure shown in FIG. 5K including second connection holes 514a/513a/512a is obtained. It can be considered that the structure shown in FIG. 2D is included in the structure shown in FIG. 5K.

Next, a barrier metal is formed on inner surfaces of the second connection holes 514a/513a/512a and top edges of the opening patterns 514a in substantially the same process as described above, and then Cu lines in the third layer are formed.

Then, substantially the same process is repeated. As a result, as shown in, for example, FIG. 5L, a line structure including Cu lines in the first through fifth layers is obtained. It can be considered that the structure shown in FIG. 2D is included in the structure shown in FIG. 5L.

In a cross-sectional view shown in FIG. 5L, even-numbered layers, more specifically, the second and fourth layers each include Cu lines that are not connected to the Cu lines in the layer above or the layer below. In this manner, the layers including such non-connected Cu lines are provided so as not to be adjacent to each other, namely, so as to have another layer therebetween. Because of this structure, the line capacitance between the Cu lines can be controlled. The present invention is not limited to having the cross-sectional view shown in FIG. 5L, and such non-connected Cu lines may be located in any layer.

The thermal-curing temperature of polyimide is set to be lower in an upper layer than in a lower layer. Because of this, the thermal load on the polyimide in the lower layer is decreased. As a result, peel-off of the films or a disconnecting, which would be caused by the thermal stress or the thermal expansion of the polyimide, the P—SiN films, the P—SiO$_2$ films and the Cu lines, becomes unlikely to occur. In the case where there are a large number of layers, it is preferable to set the thermal-curing temperature to be lower in an upper layer than in a lower layer, and also set the temperature, for film formation performed by use of plasma, to be lower in an upper layer than in a lower layer.

Now, in FIG. 5L, it may be assumed as follows: the third layer is the first layer, the second layer is the second layer, the Cu lines in the first layer is first Cu lines, and the Cu lines in the second layer is second Cu lines. In this case, the first inorganic film (e.g., P—SiN film) covers a surface of each Cu line in the second layer that faces the first layer, and also covers a side surface of each Cu line in the second layer.

Figure 5K:
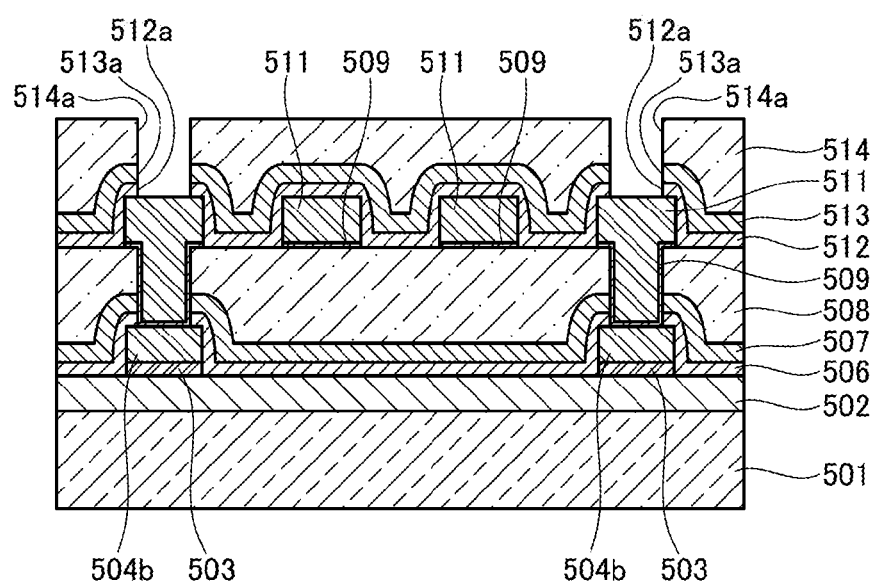
FIG. 5K shows the method for producing the line structure in the embodiment according to the present invention.
Figure 5L:
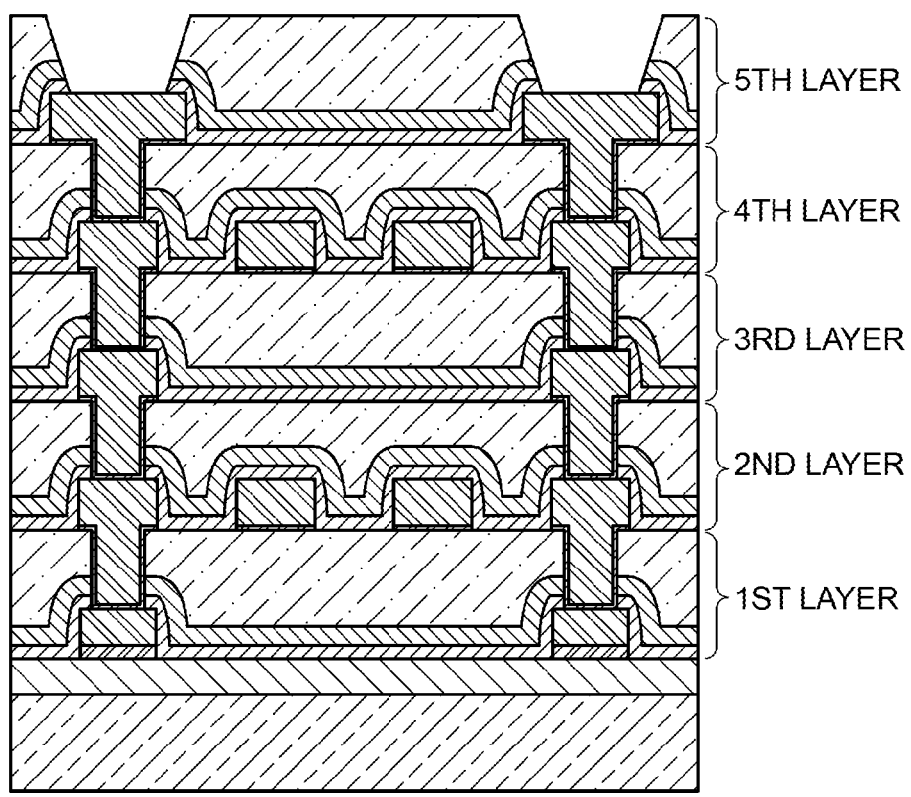
FIG. 5L shows the method for producing the line structure in the embodiment according to the present invention.

In the line structure shown in FIG. 5L, each layer includes a P—SiN film and a P—SiO$_2$ film that are formed of an inorganic material. The present invention is not limited to having such a structure, and the line structure may include a layer that does not include a P—SiN film or a P—SiO$_2$ film.

Figure 5M:
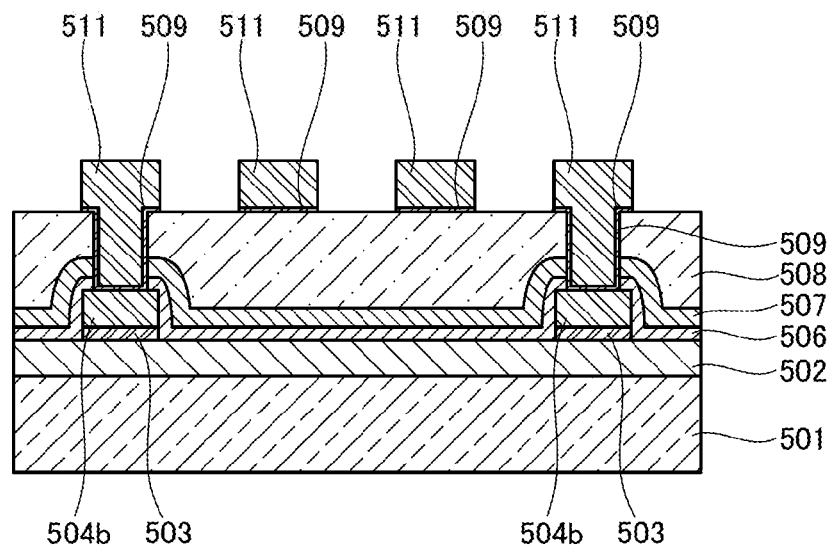
FIG. 5M shows the method for producing the line structure in the embodiment according to the present invention.

For example, FIG. 5M, like FIG. 5I, shows a state where the Cu lines 504b in the first layer and the Cu lines 511 in the second layer are connected to each other through the via connection parts formed in the first connection holes.

Figure 5N:
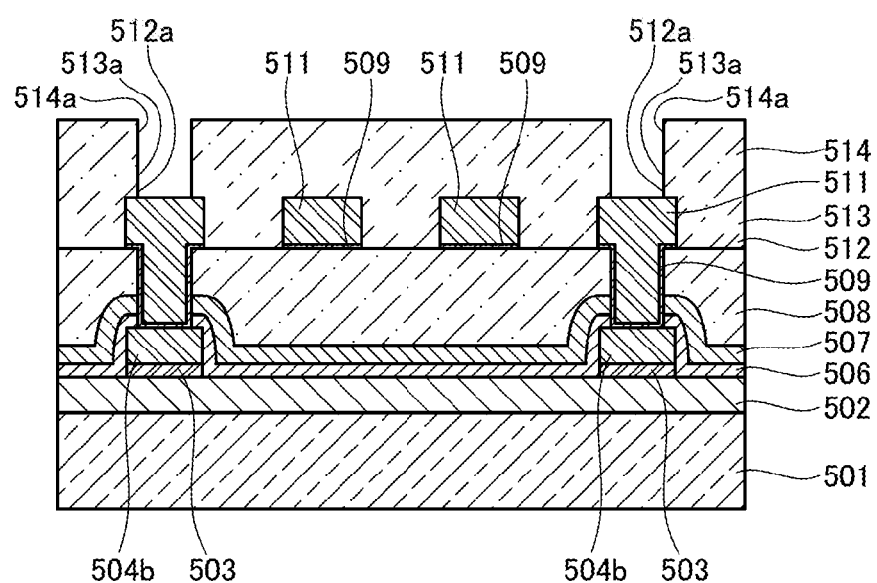
FIG. 5N shows the method for producing the line structure in the embodiment according to the present invention.

After the structure shown in FIG. 5E is obtained, a structure shown in FIG. 5N may be obtained as follows. Neither P—SiN film nor a P—SiO$_2$ film, both of which are formed in order to obtain the structure shown in FIG. 5J, is formed. Photosensitive polyimide is applied so as to have a thickness of 9.4 μm above the Cu lines. The applied polyimide is exposed by use of a photomask and development is performed to form opening patterns 514a at necessary positions above the Cu lines 511 in the second layer. Then, the polyimide is cured. Thus, the structure shown in FIG. 5N is obtained. FIG. 5N and FIG. 5K will be compared. In FIG. 5K, the Cu lines 511 in the second layer are covered with the first inorganic film 512 and the second inorganic layer 513 except for in the openings 514a. By contrast, in FIG. 5N, neither the first inorganic film 512 nor the second inorganic layer 513 is present, and the Cu lines 511 in the second layer are not covered with a first inorganic film or a second inorganic layer.

Figure 5O:
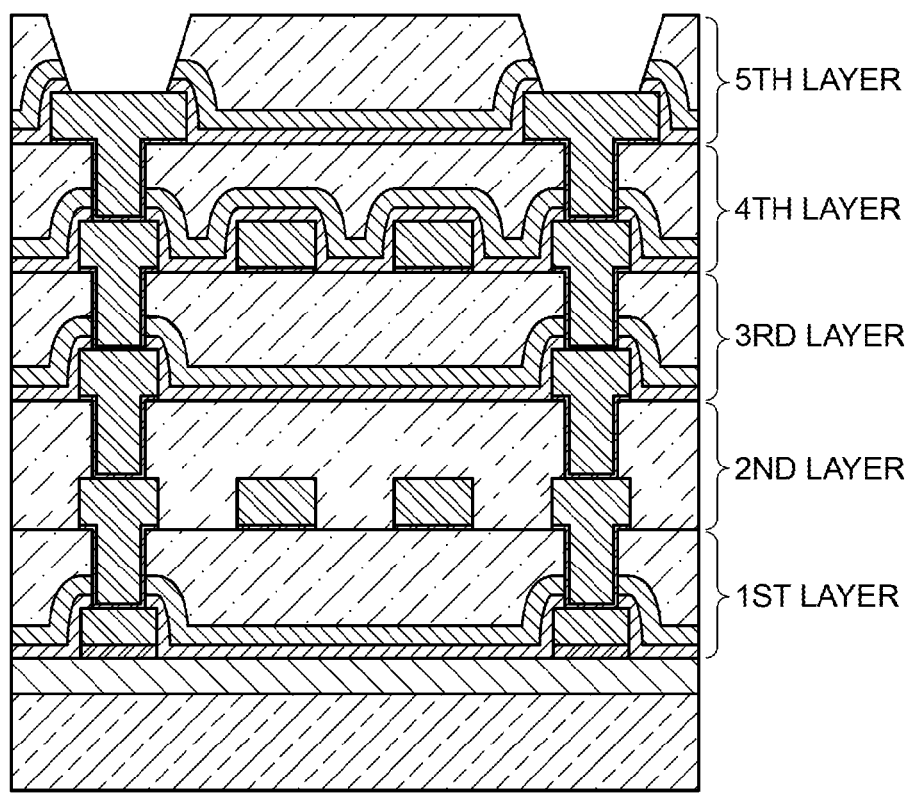
FIG. 5O shows the method for producing the line structure in the embodiment according to the present invention.

The Cu lines in the third layer, the Cu lines in the fourth layer and the Cu lines in the fifth layer are covered with a first inorganic film and a second inorganic film except for in the openings formed in the organic resin films. As a result, a line structure shown in FIG. 5O is obtained. FIG. 5O and FIG. 5L will be compared. In FIG. 5L, the Cu lines in the second layer are covered with the first inorganic film and the second inorganic film except for in the openings. By contrast, in FIG. 5O, the Cu lines in the second layer are not covered with the a first inorganic film and a second inorganic film. Therefore, the Cu lines in the second layer are considered to be located between the organic resin film in the first layer and the organic resin film in the second layer.

The via connection parts used to connect the Cu lines in the first layer and the Cu lines in the third layer to each other are each divided into an upper part belonging to the second layer and a lower part belong to the first layer. The division is made by the Cu line located between the Cu line in the first layer and the Cu line in the third layer among the Cu lines in the second layer. In other words, the upper part is located above the Cu line located between the Cu line in the first layer and the Cu line in the third layer, and the lower part is located below the Cu line located between the Cu line in the first layer and the Cu line in the third layer. Between the upper part, and the Cu line located between the Cu line in the first layer and the Cu line in the third layer, namely, at a bottom part of the upper part, a barrier conductive material is located.

The Cu lines that are not covered with a first inorganic film and a second inorganic film are not limited to being located in the second layer, and may be located in any layer. Alternatively, Cu lines that are not covered with a first inorganic film and a second inorganic film may be located in continuous layers.

Since the Cu lines that are not covered with a first inorganic film and a second inorganic film are provided as described above, the steps of forming the first inorganic film and the second inorganic film can be omitted, which decreases the number of production steps. In addition, the thickness of the organic resin film can be controlled, the warp of the substrate 101 can be controlled, and the impedances can be matched among the lines.

As shown especially in FIG. 5L and FIG. 5O, between the second and third Cu lines from the left among the four Cu lines in the second layer, and the second and third Cu lines from the left among the four Cu lines in the fourth layer, only insulating layers are present with no other Cu line being located. In this manner, a layer in which no Cu line is arranged is located between Cu lines in one layer and Cu lines in a layer over the one layer; namely, no Cu line is located in a layer between one layer and a layer over the one layer. Because of this arrangement, the impedances can be matched between the Cu lines in the one layer and the Cu lines in the layer over the one layer. The number of layer(s) between the one layer and the layer over the one layer may be one, or two or more. Between the Cu lines in the one layer and the Cu lines in the layer over the one layer, only an organic insulating layer may be located, or any number of inorganic insulating layer(s) may be located. Because of such an arrangement, the impedances can be matched between the Cu lines in the one layer and the Cu lines in the layer over the one layer, and thus transfer characteristics can be improved.

Embodiment 3

Figure 8A:
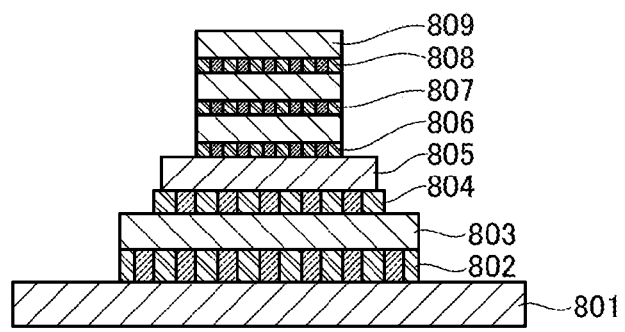
FIG. 8A shows an example of structure including LSI chips arranged by use of line structures in an embodiment according to the present invention.

FIG. 8A shows an arrangement of chips made by use of line structures according to embodiment 3 of the present invention. This is an example of an arrangement of so-called three-dimensional mounting.

As shown in FIG. 8A, a CPU 803 is located on a motherboard 801 with an interposer 802 being provided therebetween. On the CPU 803, an ASIC 805 is located with an interposer 804 being provided therebetween. On the ASIC 805, a DRAM is located with an interposer 806 being provided therebetween. Another DRAM is located thereon with another interposer 807 being provided therebetween, and a DRAM 809 is located thereon with still another interposer 808 being provided therebetween. The interposers 802, 804, 806, 807 and 808 each have a line structure in this embodiment at both of a top surface and a bottom surface thereof so as to be bump-connected with each of the LSIs.

Because of such three-dimensional mounting, signal lines, power supply lines and ground lines of the LSIs are connected via the Cu lines in the interposers. Three-dimensional mounting, in which the lines to be connected are shorter than in the 2.5-dimensional mounting, is suitable for higher speed information processing.

Figure 8B:
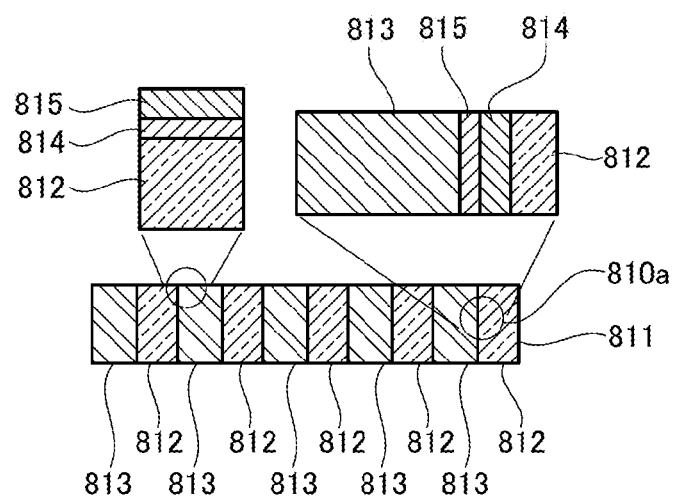
FIG. 8B shows an example of structure including LSI chips arranged by use of line structures in an embodiment according to the present invention.

FIG. 8B shows a cross-section of an Si interposer as an example of interposer. The Si interposer includes Cu embedded, by electrolytic plating, in a plurality of vias running through an Si substrate having a thickness of 300 μm. For example, the vias may each have a diameter of 10 μm and may be located at a pitch of 40 μm. In this embodiment, lines each having a width of 1 μm or less and stacked vias can be formed. Therefore, line layers can be stacked at a high density even on an interposer including vias at such a small pitch.

As shown in FIG. 8B, in order to insulate the Cu in the Si interposer and the Si substrate, a P—SiO$_4$ film 814 and a P—SiN film 815 are formed in this order on an inner surface of each via, and Cu 813 is embedded in an inner surface of the P—SiN film 815. For example, the P—SiO$_4$ film 814 has a thickness of 0.5 μm, and the P—SiN film 815 has a thickness of 0.1 μm. A P—SiO$_4$ film 814 and a P—SiN film 815 are also formed on each of a top surface and a bottom surface of the Si interposer.

Figure 9A:
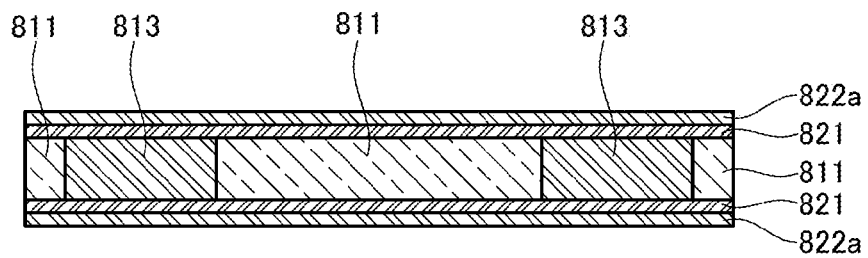
FIG. 9A shows a method for producing the line structure in the embodiment according to the present invention.

As shown in FIG. 9A, a Ti film 821 having a thickness of 0.1 μm and a Cu film 822a having a thickness of 0.3 μm are formed by sputtering on each of a top surface and a bottom surface of an Si interposer 811. The Ti film 821 acts as a barrier metal for preventing the diffusion of Cu in the Si substrate. The Cu film 822a acts as a seed from which a Cu layer is grown by electrolytic plating in a later step.

Figure 9B:
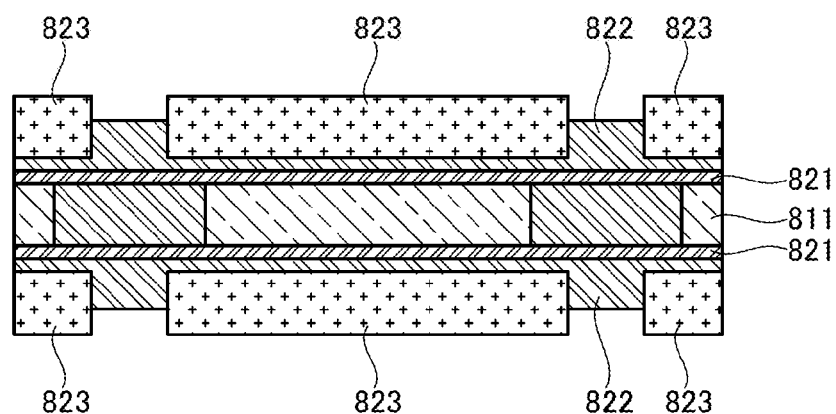
FIG. 9B shows a method for producing the line structure in the embodiment according to the present invention.

Next, as shown in FIG. 9B, a photoresist is applied onto the Cu film 822a, and exposure and development are performed to form a line pattern 823. Then, a Cu layer 822 having a thickness of 2.2 µm is grown by electrolytic plating on an exposed part of the Cu film 822a. Cu lines in a first layer to be formed of the Cu layer 822 is designed to have a thickness of 2.0 µm.

Figure 9C:
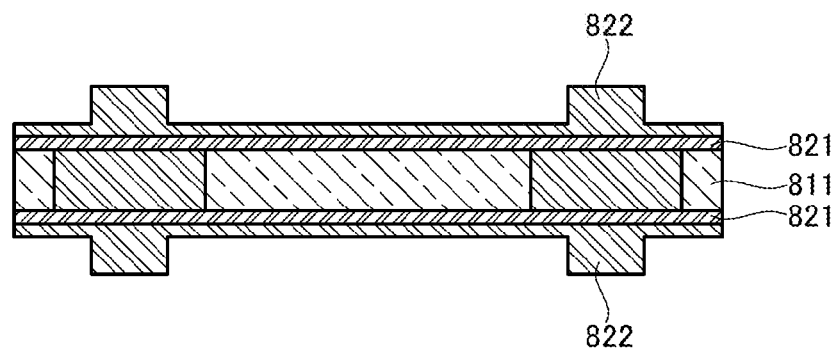
FIG. 9C shows a method for producing the line structure in the embodiment according to the present invention.

After the Cu layer 822 is grown, the photoresist forming the line pattern 823 is removed with, for example, an organic solvent. As a result, a structure shown in FIG. 9C is obtained. As described above, the photoresist may be removed by ashing with oxygen plasma instead of with an organic solvent.

Figure 9D:
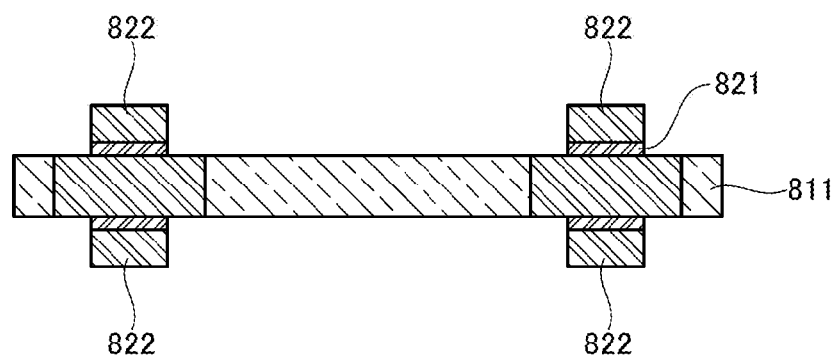
FIG. 9D shows a method for producing the line structure in the embodiment according to the present invention.

Next, as shown in FIG. 9D, an exposed part of the Cu film 822a and a part of the Ti film 821 below the exposed part of the Cu film 822a are removed with an acidic aqueous solution, and thus the Cu lines in the first layer are formed of the Cu layer 822. As a result of the exposed part of the Cu film 822a being removed, the thickness of the Cu layer 822 can be decreased to 2.0 µm, which is the designed size. The exposed part of the Cu film 822a and the part of the Ti film 821 below the exposed part of the Cu film 822a may be removed by ion milling.

Figure 9E:
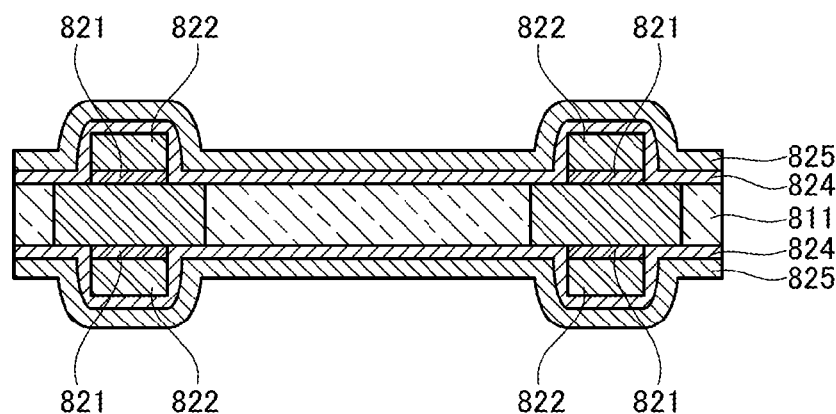
FIG. 9E shows a method for producing the line structure in the embodiment according to the present invention.

Next, as shown in FIG. 9E, a P—SiN film 824 having a thickness of 0.1 µm is formed by plasma CVD on the Cu lines in the first layer, and then a P—SiO$_2$ film 825 having a thickness of 1 µm is formed thereon. It can be considered that the structure shown in FIG. 2A is included in the structure shown in FIG. 9E. Since the P—SiN film 824 and the P—SiO$_2$ film 825 are formed on side surfaces of the Cu lines in the first layer, the interval between the Cu lines adjacent to each other as seen in a plan view can be decreased.

In the case where the density or the pattern of the Cu lines in the first layer is different between at the top surface and at the bottom surface of the interposer 811, a residual stress of the lines is different between the surfaces, and thus the interposer 811 may be warped toward one side. In this case, the thickness or the film stress of the P—SiO$_2$ film on one of the surfaces is changed, so that the warp can be controlled. For example, the film stress of the P—SiO$_2$ film 825 may be adjusted to −200 MPa.

Next, copper oxide present on the surfaces of the Cu lines in the first layer is removed as in embodiment 2.

Next, photosensitive polyimide is applied by spin coating onto the P—SiO$_2$ film 825 on the top surface of the interposer 811 so as to have a thickness of 4.7 µm above the Cu lines. As in embodiment 2, a resin different from polyimide may be used.

The applied polyimide is exposed by use of a photomask and development is performed to form, above the interposer 811, a pattern 826 including openings 826a at necessary positions above the Cu lines in the first layer.

Similarly, a pattern 826 including openings 826a is formed also below the interposer 811.

Figure 9F:
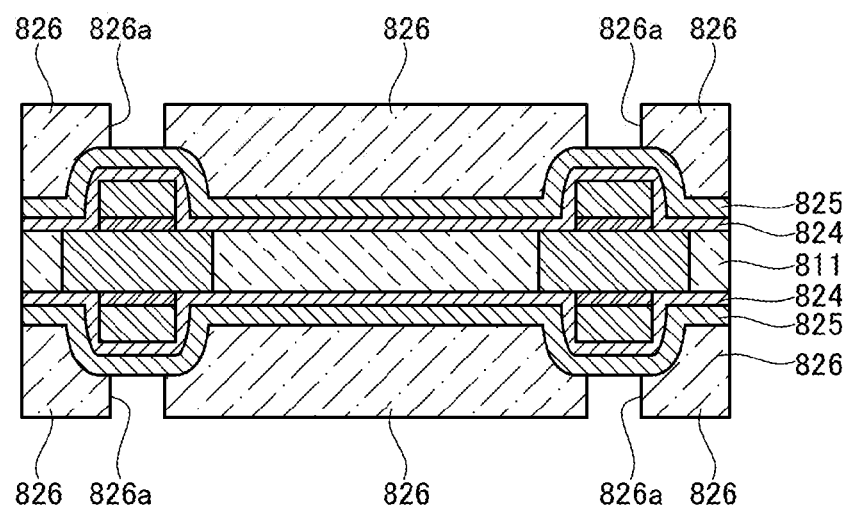
FIG. 9F shows the method for producing the line structure in the embodiment according to the present invention.

Then, the polyimide is cured as in the above embodiments. As a result, a structure shown in FIG. 9F is obtained. It can be considered that the structure shown in FIG. 2C is included in the structure shown in FIG. 9F.

Figure 9G:
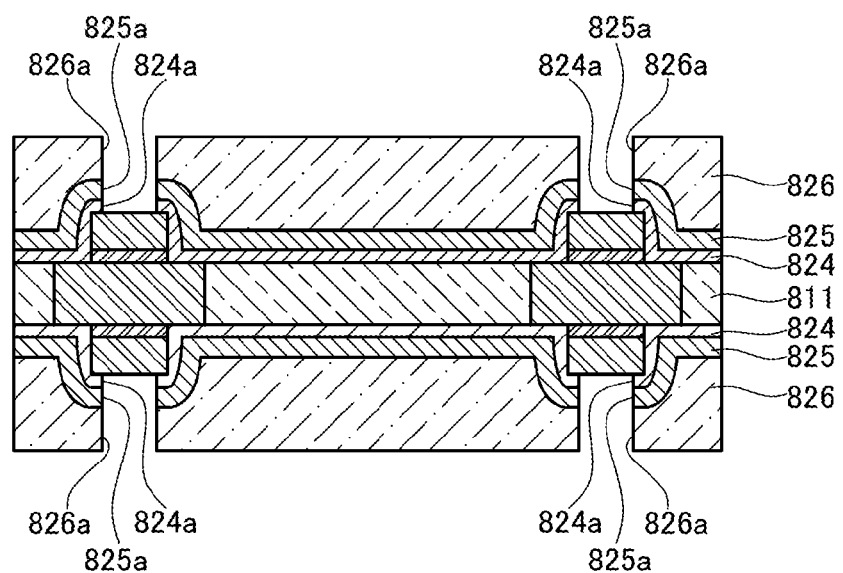
FIG. 9G shows the method for producing the line structure in the embodiment according to the present invention.

Next, the P—SiO$_2$ film 825 and the P—SiN film 824 are etched by plasma etching with the pattern 826 above the interposer 811 being used as a mask, to form first connection holes 826a/825a/824a. Similarly, first connection holes 826a/825a/824a are formed also below the interposer 811. As a result, a structure shown in FIG. 9G is obtained. It can be considered that the structure shown in FIG. 2D is included in the structure shown in FIG. 9G.

Then, as in embodiment 2, a carbon compound containing Si of F adhering to side walls or bottom parts of the first connection holes is removed, the oxidized surfaces of the Cu lines are removed, and the polyimide damaged by plasma etching is heat-treated to be recovered.

Figure 9H:
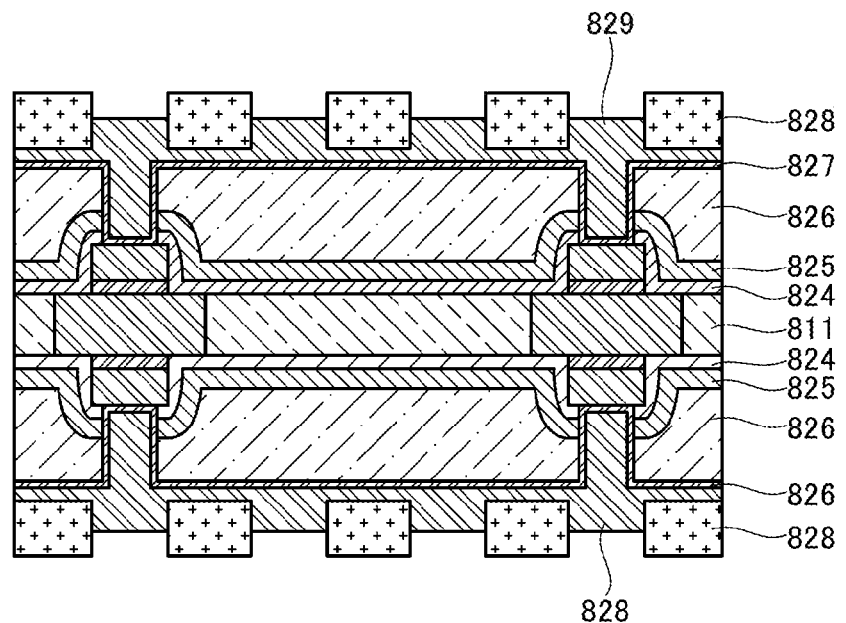
FIG. 9H shows the method for producing the line structure in the embodiment according to the present invention.

Next, a Ti film having a thickness of 0.1 µm and a Cu film 827 having a thickness of 0.3 µm are formed above the interposer 811 by sputtering. Similarly, a Ti film and a Cu film 827 are formed also below the interposer 811. Then, a photoresist is applied onto the Cu film 827 above the interposer 811, and exposure and development are performed to form a line pattern 828. Similarly, a line pattern 828 is formed also below the interposer 811. A Cu layer 829 having a thickness of 2.2 µm is grown by electrolytic plating on an exposed part of each of the Cu films 827. As a result, a structure shown in FIG. 9H is obtained. The Cu lines are designed to have a thickness of, for example, 2.0 µm.

Figure 9I:
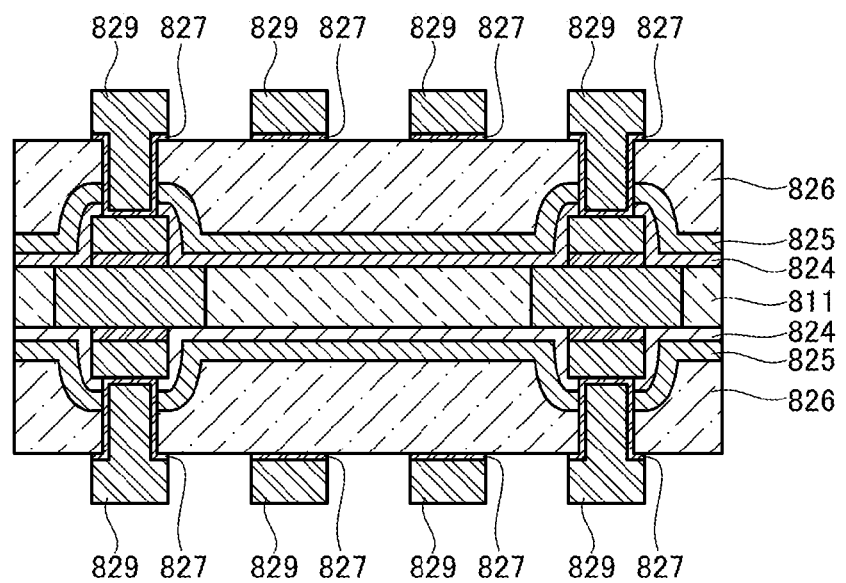
FIG. 9I shows the method for producing the line structure in the embodiment according to the present invention.

Next, in substantially the same manner as in the above embodiments, the photoresist forming the line patterns 828 is removed, and the exposed part of each Cu film 827 and a part of each Ti film corresponding to the exposed part of each Cu film 827 are removed. As a result, a structure shown in FIG. 9I is obtained. Since the exposed part of each Cu film 827 is removed, the thickness of each Cu layer 829 can be made the designed value. Because of this step, as shown in FIG. 9I, lines in each second layer are formed of the Cu layer 829 and are connected to the lines in the first layer. It can be considered that the structure shown in FIG. 2H is included in the structure shown in FIG. 9I.

Figure 9J:
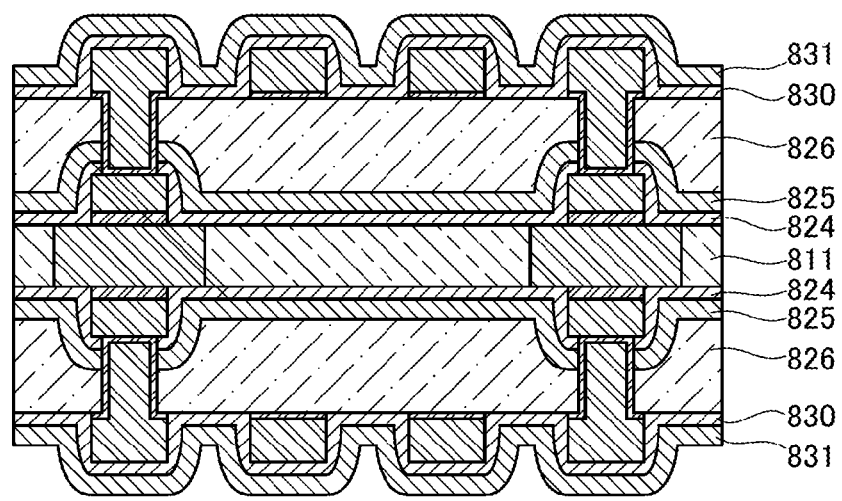
FIG. 9J shows the method for producing the line structure in the embodiment according to the present invention.

Next, as shown in FIG. 9J, a P—SiN film 830 having a thickness of 0.1 µm is formed by plasma CVD above and below the interposer 811, and a P—SiO$_2$ film 831 having a thickness of 1 µm is formed thereon above and below the interposer 811. The reaction system is substantially the same as that used for forming the P—SiN film 824 and the P—SiO$_2$ film 825. The temperature for the film formation is set so as not to exceed the glass transition temperature of polyimide. It can be considered that the structure shown in FIG. 2A is included in the structure shown in FIG. 9J.

As in embodiment 2, before the above-mentioned films are formed, the Cu lines in the second layers are washed in order to remove copper oxide from the surfaces of the Cu lines, and water is removed from the pattern of polyimide 826.

Figure 9K:
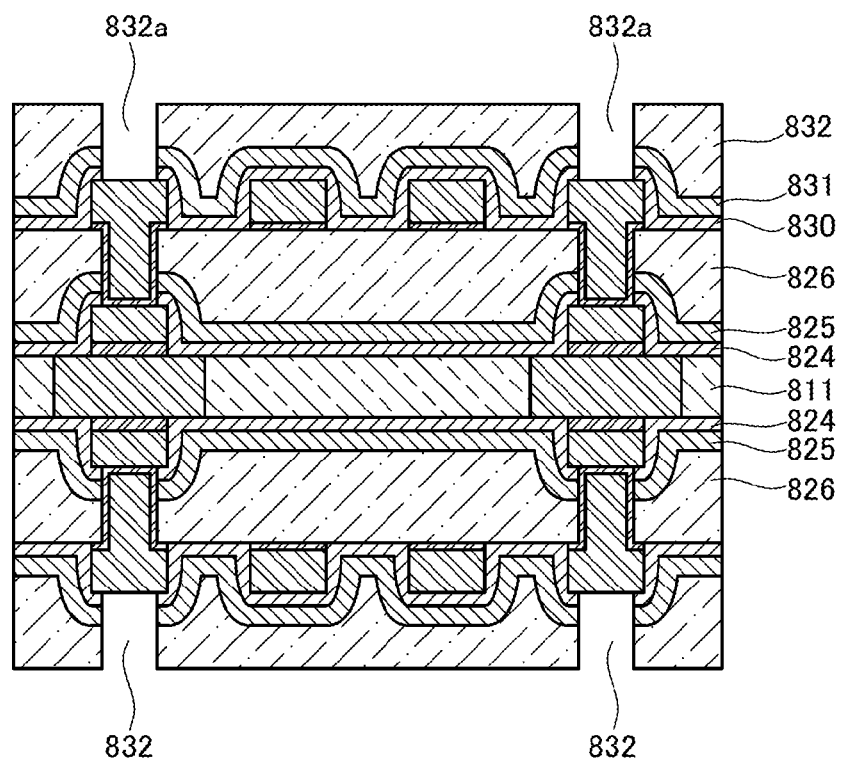
FIG. 9K shows the method for producing the line structure in the embodiment according to the present invention.

Next, photosensitive polyimide or the like is applied above the interposer 811 so as to have a thickness of 4.7 µm, and exposure and development are performed to form a pattern 832 including openings 832a at necessary positions above the Cu lines in the second layer. Similarly, a pattern 832 is formed also below the interposer 811. Then, as in embodiment 2, the polyimide is cured. The P—SiO$_2$ films 831 and the P—SiN films 830 are etched with the polyimide being used as a mask. As a result, a structure shown in FIG. 9K including second connection holes 832a is obtained. It can be considered that the structure shown in FIG. 2D is included in the structure shown in FIG. 9K.

Figure 9L:
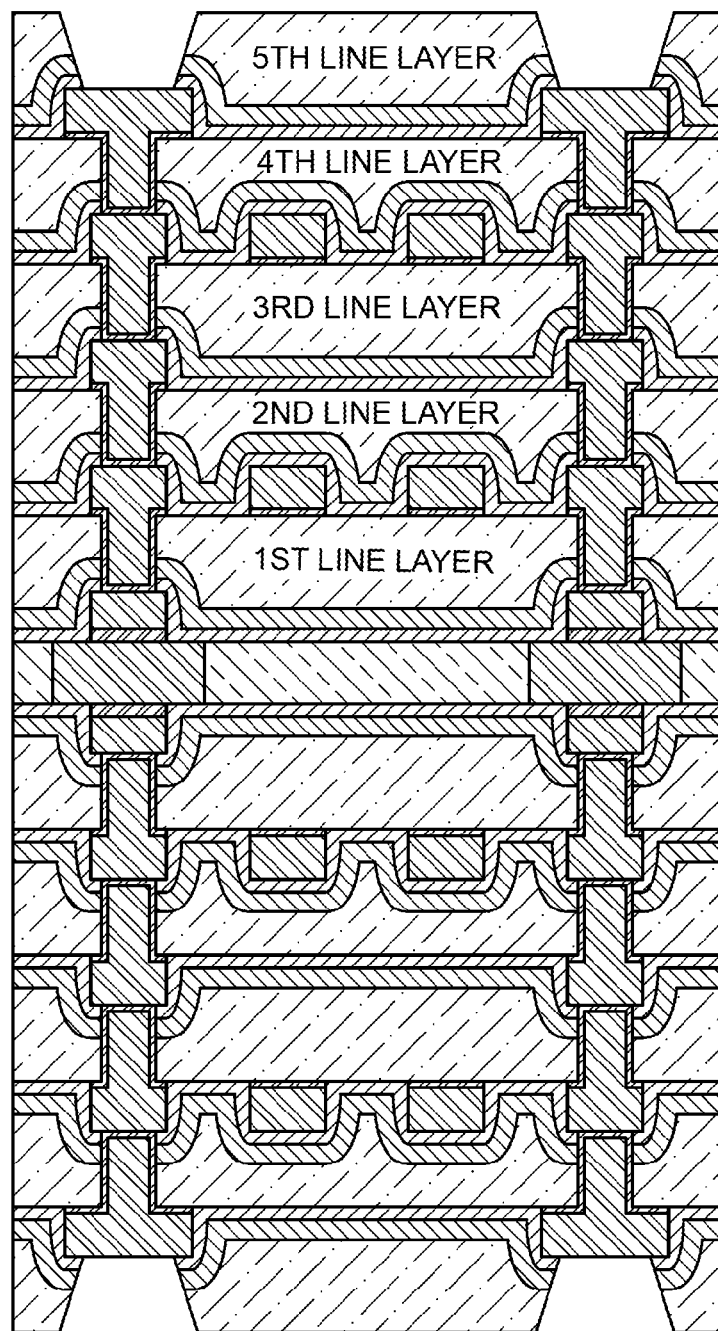
FIG. 9L shows the method for producing the line structure in the embodiment according to the present invention.

After Cu lines 829 in the second layers are exposed to bottom parts of the second connection holes 832a, substantially the same process is repeated to form Cu lines in third layers. In substantially the same manner, as shown in FIG. 9L, Cu lines in fourth layers and Cu lines in fifth layers can be formed. It can be considered that the structure shown in FIG. 2D is included in the fifth layer in the structure shown in FIG. 9L.

As in embodiment 2, the thermal-curing temperature of polyimide is set to be lower in an upper layer than in a lower layer. Because of this, the thermal load on the polyimide in the lower layer is decreased. As a result, peel-off of the films or a disconnecting, which would be caused by the thermal stress or the thermal expansion of the polyimide, the P—SiN films, the P—SiO$_2$ films and the Cu lines, becomes unlikely to occur. Also as in embodiment 2, in the case where there are a large number of layers, it is preferable to set the thermal-curing temperature to be lower in an upper layer than in a lower layer, and also set the temperature, for film formation performed by use of plasma, to be lower in an upper layer than in a lower layer.

In this embodiment, a same number of Cu lines are formed on both sides of the interposer 811. As necessary, the number of Cu lines above the interposer 811 may be different from the number of Cu lines below the interposer 811.

In this embodiment, as described above in embodiment 2, there may be a layer in which Cu lines are not covered with a first inorganic film or a second inorganic film. Layers including such non-connected Cu lines may be provided so as not to be adjacent to each other, namely, so as to have another layer therebetween.

EXAMPLES

Figure 11:
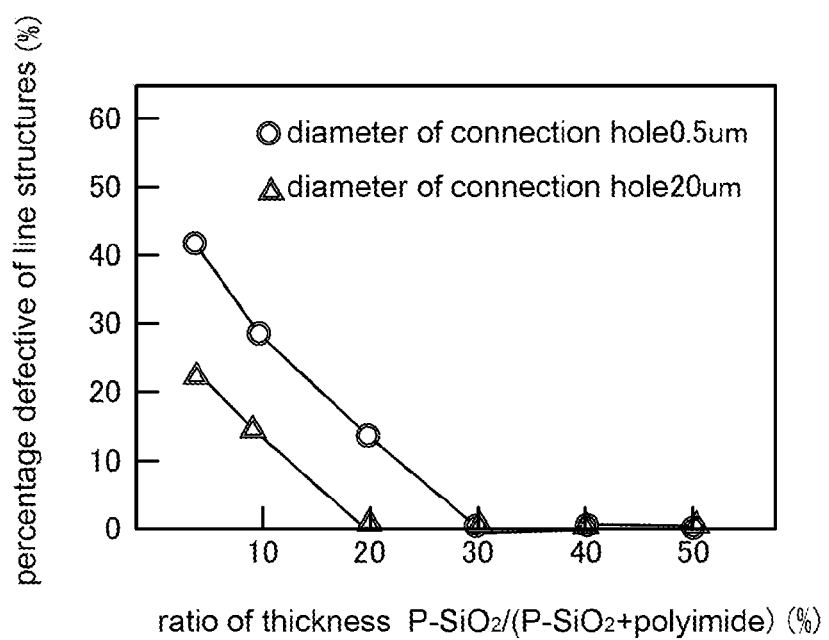
FIG. 11 is a graph showing the ratio of defective line structures produced in an embodiment according to the present invention.

FIG. 11 is a graph showing the percentage defective of line structures as a result of a heat cycle test. The line structures were formed on Si interposers by the method described above in embodiment 3. For this heat cycle test, a stack via chain (number of chains: 100) including four layers connected to each other through a via connection part was formed on each of a top surface and a bottom surface of the Si interposer. A temperature cycle of −25° C. to 125° C. was repeated 3000 times. When the chain resistance was raised by 20% or more, the line structure was determined to be defective.

Two types of measurement samples were prepared; one type had a diameter of the connection hole of 0.5 μm, and the other type had a diameter of the connection hole of 20 μm. The diameter of the connection hole of 0.5 μm is a resolution limit in the exposure and development of polyimide. The diameter of the connection hole of 20 μm is the maximum possible diameter with which size reduction is advantageous. In the connection hole, the ratio of the thickness of P—SiO$_2$ was changed. The ratio of the thickness of P—SiO$_2$ was calculated with the thickness of P—SiN (fixed at 0.1 μm) being included.

Figure 10:
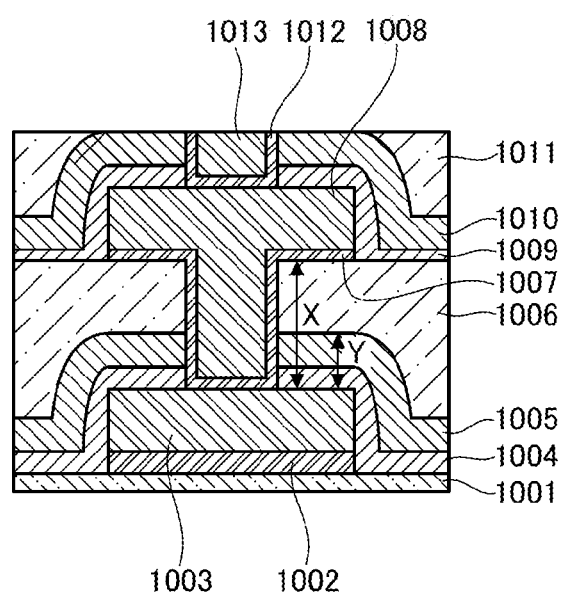
FIG. 10 shows an example of cross-section of a line structure in an embodiment according to the present invention.

The ratio of the thickness of P—SiO$_2$ is calculated by [P—SiO$_2$ thickness/(P—SiO$_2$ thickness+polyimide thickness)]. This will be described more specifically with reference to FIG. 10. A distance from a top end of a line 1003 in a first layer to a bottom end of a barrier metal below a line 1008 in a second layer, namely, the height of the connection hole, is set to X. The thickness of P—SiO$_2$ in an area between the top end of the line 1003 in the first layer and the bottom end of the barrier metal below the line 1008 in the second layer is set to Y. The ratio of the thickness of P—SiO$_2$ is a value calculated by Y/X. Namely, Y/X is the ratio of P—SiO$_2$ with respect to the height of the connection hole (length of the connection hole running through the insulating layers).

As shown in FIG. 11, as Y/X increased, the percentage defective of line structures decreased. When the diameter of the connection hole was 20 μm, the percentage defective of line structures was 0% at Y/X of 20%. When the diameter of the connection hole was 0.5 μm, the percentage defective of line structures was 0% at Y/X of 30%. From these results, it is considered that the ratio of the thickness of the P—SiO$_2$ film in the connection hole is preferably 20% or greater, and more preferably 30% or more. Strictly describing, Y/X is calculated with the thickness of the P—SiN film being included. Therefore, it may be considered that the ratio of the thickness of the inorganic film containing Si is preferably 20% or greater. However, when the ratio of the thickness of the P—SiO$_2$ film is excessively high, the line capacitance between upper and lower lines is increased and it becomes difficult to match the impedances. Therefore, it is preferable that the ratio of the thickness of the P—SiO$_2$ film is 80% at the maximum.

Figure 12A:
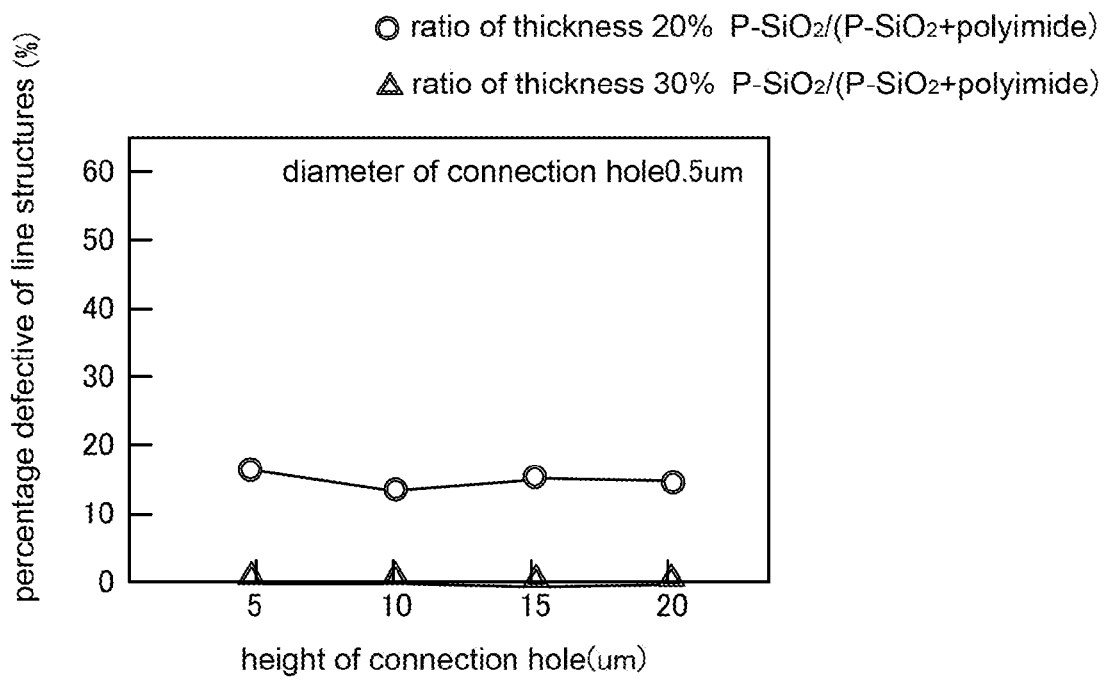
FIG. 12A is a graph showing the ratio of defective line structures produced in an embodiment according to the present invention.
Figure 12B:
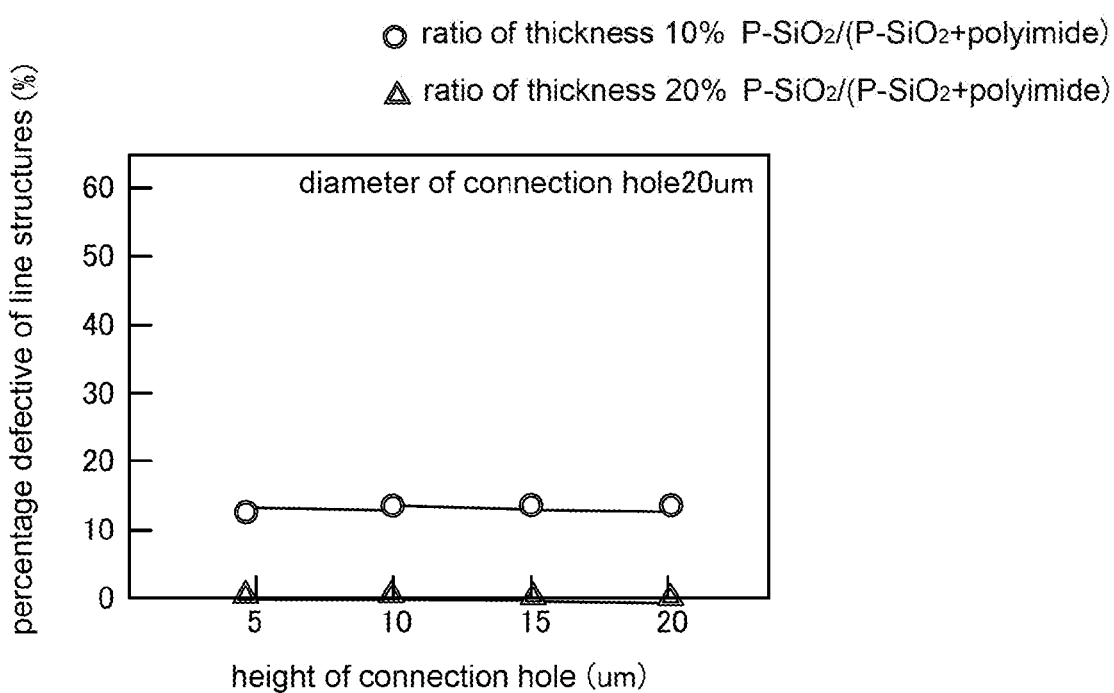
FIG. 12B is a graph showing the ratio of defective line structures produced in an embodiment according to the present invention.

FIG. 12A and FIG. 12B shows the percentage defective of line structures as a result of the above-described heat cycle test. The line structures were formed on Si interposers by the method described above in embodiment 3. Two types of measurement samples were prepared; one type had a diameter of the connection hole of 0.5 μm, and the other type had a diameter of the connection hole of 20 μm. The height of the connection hole was changed in the range of about 5 μm to 20 μm. When the diameter of the connection hole was 0.5 μm, the ratio of the thickness of the P—SiO$_2$ film (including the thickness of P—SiN, i.e., 0.1 μm) with respect to the height of the connection hole, namely, Y/X, was set to 20% and 30%. When the diameter of the connection hole was 20 μm, the ratio of the thickness of the P—SiO$_2$ film (including the thickness of P—SiN, i.e., 0.1 μm) with respect to the height of the connection hole was set to 10% and 20%.

When the diameter of the connection hole was 0.5 μm and the ratio of the thickness was 20%, the percentage defective of line structures was about 18% regardless of the height of the connection hole. When the ratio of the thickness was increased to 30%, the percentage defective of line structures was decreased to 0% regardless of the height of the connection hole. When the diameter of the connection hole was 20 μm and the ratio of the thickness was 10%, the percentage defective of line structures was about 15% regardless of the height of the connection hole. When the ratio of the thickness was increased to 20%, the percentage defective of line structures was decreased to 0% regardless of the height of the connection hole.

From the above results, it has been found that when the diameter of the connection hole is in the range of 0.5 μm or greater and 20 μm or less, the height of the connection hole does not influence the ratio of defective line structures. Even if the height of the connection hole is changed, as long as the ratio of the thickness of the P—SiO$_2$ film is the same, thermal expansion of polyimide is suppressed by the high elastic modulus of P—SiO$_2$. It is considered that the strong adhesive force between P—SiO$_2$ and the barrier metal also alleviates the tensile stress of Cu in the connection hole, and thus suppresses formation of voids in the bottom part of the via connection hole to decrease the ratio of defective line structures.

The invention claimed is:
1. A multi-layer line structure comprising:
a substrate;
a first line layer located on a first surface of the substrate;
a second line layer located on a first insulating layer including a first inorganic layer located above the first line layer and a first organic resin film located on the first inorganic layer;
a first via connection part located in a first via connection hole running in an up-down direction through the first insulating layer in an area where the first line layer and the second line layer overlap each other;

an organic insulating layer located between the substrate and the first line layer, the organic insulating layer having a third line layer therein, the third line layer being electrically connected to the first line layer, the organic insulating layer covering whole side surfaces of the third line layer;

a second insulating layer located between the substrate and the third line layer; and a second via connection part located in a second via connection hole running in an up-down direction through the second insulating layer, the second via connection part being electrically connected to the third line layer.

2. The multi-layer line structure according to claim 1, wherein the first via connection part includes a first barrier conductive layer located on a part of the first line layer exposed to a bottom part of the first via connection hole and on an inner wall of the first via connection hole.

3. The multi-layer line structure according to claim 1, wherein the first inorganic layer includes a first inorganic film and a second inorganic film.

4. The multi-layer line structure according to claim 3, wherein:
the first inorganic film wholly covers and is in contact with a side surface of the first line layer and a top surface of the first line layer other than a part of the top surface overlapping with the first via connection hole; and
the second inorganic film wholly covers and is in contact with the first inorganic film.

5. The multi-layer line structure according to claim 4, wherein:
an end of the first inorganic film is in contact with the first barrier conductive layer located on the inner wall of the first via connection hole; and
an end of the second inorganic film is in contact with the first barrier conductive layer located on the inner wall of the first via connection hole.

6. The multi-layer line structure according to claim 1, wherein the substrate has a wiring.

7. The multi-layer line structure according to claim 1, wherein the second via connection part includes a second barrier conductive layer located on an inner wall of the second via connection hole.

8. The multi-layer line structure according to claim 1, further comprising;
a fourth line layer located on a second surface of the substrate, the second surface being opposed to the first surface;
a fifth line layer located on a second insulating layer including a second inorganic layer located on the fourth line layer and a second organic resin film located on the second inorganic layer;
a second via connection part located in a second via connection hole running in an up-down direction through the second insulating layer in an area where the fourth line layer and the fifth line layer overlap each other; and a conductive part formed in the substrate, the conductive part electrically connecting the first line layer and the fourth line layer.

9. The multi-layer line structure according to claim 8, wherein:
the third via connection part includes a second barrier conductive layer located on a part of the fourth line layer exposed to a bottom part of the third via connection hole and on an inner wall of the third via connection hole.

10. The multi-layer line structure according to claim 8, wherein the second inorganic layer includes a third inorganic film and a fourth inorganic film.

11. The multi-layer line structure according to claim 10, wherein:
the third inorganic film wholly covers and is in contact with a side surface of the fourth line layer and a top surface of the fourth line layer other than a part of the top surface overlapping with the second via connection hole; and
the fourth inorganic film wholly covers and is in contact with the third inorganic film.

12. The multi-layer line structure according to claim 11, wherein:
an end of the third inorganic film is in contact with the second barrier conductive layer located on the inner wall of the second via connection hole; and
and an end of the fourth inorganic film is in contact with the second barrier conductive layer located on the inner wall of the second via connection hole.

13. A multi-layer line structure comprising:
a first line layer;
a second line layer located on a first organic resin film located on the first line layer;
a first via connection part located in a first via connection hole running in an up-down direction through the first organic resin film in an area where the first line layer and the second line layer overlap each other; and
a first insulating layer including a first inorganic layer located on the second line layer and a second organic resin film located on the first inorganic layer, the first inorganic layer being insulating, wherein
the first inorganic layer directly covers at least a part of a top surface the second line layer,
the first inorganic layer includes a first inorganic film and a second inorganic film, and
the first inorganic film wholly covers and is in contact with a side surface of the second line layer and at least the part of the top surface of the second line layer; and
the second inorganic film wholly covers and is in contact with the first inorganic film.

14. The multi-layer line structure according to claim 13, wherein the first organic resin film covers whole side surfaces of the first line layer and a part of a top surface of the first line layer.

15. The multi-layer line structure according to claim 13, wherein the first via connection part includes a first barrier conductive layer located on a part of the first line layer exposed to a bottom part of the first via connection hole and on an inner wall of the first via connection hole.

* * * * *